United States Patent
Nagai

(10) Patent No.: US 7,939,905 B2
(45) Date of Patent: May 10, 2011

(54) ELECTROSTATIC DISCHARGE PROTECTION METHOD AND DEVICE FOR SEMICONDUCTOR DEVICE INCLUDING AN ELECTROSTATIC DISCHARGE PROTECTION ELEMENT PROVIDING A DISCHARGE PATH OF A SURGE CURRENT

(75) Inventor: Takayuki Nagai, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 1008 days.

(21) Appl. No.: 11/806,779

(22) Filed: Jun. 4, 2007

(65) Prior Publication Data

US 2007/0284667 A1    Dec. 13, 2007

(30) Foreign Application Priority Data

Jun. 12, 2006    (JP) .................. 2006-162001

(51) Int. Cl.
  *H01L 23/60*    (2006.01)

(52) U.S. Cl. ........ 257/479; 257/171; 257/483; 257/484; 257/577; 257/E27.019; 360/323; 361/17; 361/272

(58) Field of Classification Search .................. 257/479, 257/483, 484, 577, 171, E27.019; 361/17, 361/272; 360/323
See application file for complete search history.

(56) References Cited

FOREIGN PATENT DOCUMENTS

| JP | 2-133965 | 5/1990 |
| JP | 5-267588 | 10/1993 |
| JP | 2005-123533 | 5/2005 |

OTHER PUBLICATIONS

Japanese Office Action dated Apr. 22, 2008 with a partial English translation.

*Primary Examiner* — Thanh V Pham
(74) *Attorney, Agent, or Firm* — McGinn Intellectual Property Law Group, PLLC

(57) ABSTRACT

According to an embodiment of the present invention, an electrostatic breakdown protection method protects a semiconductor device from a surge current impressed between a first terminal and a second terminal, the semiconductor device including: a diode impressing a forward-bias current from the first terminal to the second terminal; and a bipolar transistor impressing a current in a direction from the second terminal to the first terminal under an ON state, a continuity between a collector terminal and an emitter terminal of the bipolar transistor being attained before a potential difference between the first terminal and the second terminal reaches such a level that the diode is broken down.

13 Claims, 24 Drawing Sheets

ELECTROSTATIC DISCHARGE PROTECTION METHOD AND DEVICE FOR SEMICONDUCTOR DEVICE INCLUDING AN ELECTROSTATIC DISCHARGE PROTECTION ELEMENT PROVIDING A DISCHARGE PATH OF A SURGE CURRENT

BACKGROUND OF THE INVENTION

1. Field of the Invention

The present invention relates to electrostatic discharge protection method and device for a semiconductor device. In particular, the invention relates to electrostatic discharge protection method and device for a semiconductor device with an electrostatic discharge protection element that functions as a discharge path of a surge current generated due to static charges impressed to an external terminal of the semiconductor device.

2. Description of Related Art

If static charges are impressed to a terminal of a semiconductor device, an abnormal current (hereinafter referred to as "surge current") flows through a circuit due to the static charges. If the surge current is generated, there arises a problem that a terminal voltage increases and an internal circuit is broken down, for example. The breakdown resulting from the electrostatic charges is hereinafter referred to as "electrostatic breakdown".

To that end, general semiconductor devices incorporate an electrostatic discharge protection device for the purpose of securing a surge current discharge path and preventing a terminal voltage from increasing. Japanese Unexamined Patent Application Publication No. 5-267588 discloses an example of an electrostatic discharge protection device.

FIG. 24 is a circuit diagram of an electrostatic discharge protection device 100 of the above related art. As shown in FIG. 24, the electrostatic discharge protection device 100 of the related art includes an NPN transistor 101, a PNP transistor 102, diodes 103 to 105, an input/output terminal (I/O terminal), a power supply terminal (VDD terminal), and a ground terminal (GND terminal). The I/O terminal is an input/output terminal of the semiconductor device. The I/O terminal is connected with an internal circuit. The NPN transistor 101 has a collector connected with a VDD terminal, an emitter connected with an I/O terminal, and a base connected with a GND terminal. The PNP transistor 102 has a collector connected with the GND terminal, an emitter connected with the I/O terminal, and a base connected with the VDD terminal.

The diode 103 has an anode connected with the GND terminal and a cathode connected with the VDD terminal. The diode 104 has an anode connected with the I/O terminal and a cathode connected with the VDD terminal. The diode 105 has an anode connected with the GND terminal and a cathode connected with the I/O terminal.

Description is made of how the electrostatic discharge protection device 100 protects an internal circuit against breakdown. Electrostatic charges are impressed to the I/O terminal based on a potential level of the VDD terminal or the GND terminal (reference potential). Further, as the impressed electrostatic charges, there are positive charges and negative charges. First, if positive electrostatic charges are impressed based on the potential level of the VDD terminal (VDD+ impressed), the diode 104 is reverse-biased, or the diode 105 is broken down and the diode 103 is reverse-biased. As a result, a surge current flows into the VDD terminal. On the other hand, if negative electrostatic charges are impressed based on the potential level of the VDD terminal (VDD− impressed), the breakdown of the diode 104 or the diode 103 occurs, and the diode 105 is forward-biased. Alternatively, the NPN transistor 101 is turned on due to a charging current to a parasitic capacitance of the diode 103 on the rising edge of a surge current. As a result, a negative surge current flows into the VDD terminal.

Next, if positive electrostatic charges are impressed based on the potential level of the GND terminal (GND+ impressed), the breakdown of the diode 105 or diode 103 occurs, and the diode 104 is reverse-biased. Alternatively, the PNP transistor 102 is turned on due to a charging current to a parasitic capacitance of the diode 103 on the rising edge of a surge current. As a result, a surge current flows into the GND terminal. On the other hand, if negative electrostatic charges are impressed based on the potential level of the GND terminal (GND− impressed), the diode 105 is forward-biased, or the diode 103 is forward-biased and the breakdown of the diode 104 occurs, with the result that a negative surge current flows into the GND terminal.

The electrostatic discharge protection device 100 protects the internal circuit from breakdown by discharging the surge current through the above path. Further, the electrostatic discharge protection device 100 has a trench-like insulative region (trench oxide film) around a region where a terminal connected with the I/O terminal is formed among the terminals of the element. The trench oxide film decentralizes an electric field generated at the edge of a region where the terminal connected to the I/O terminal is formed, if a surge current flows. As a result, a breakdown voltage of components of the electrostatic discharge protection circuit is increased to protect the components from breakdown if the surge current is impressed.

However, in the electrostatic discharge protection device 100 of the related art, a surge current is discharged through the broken-down path. A breakdown voltage at which the breakdown of the diode occurs is generally high. Thus, if the internal circuit is protected with the discharge path passing through the broken-down diode, the terminal voltage is higher than a breakdown voltage of the internal circuit, and the internal circuit cannot be adequately protected.

Further, an amount of current that can flow through the broken-down diode is smaller than that of the forward-biased diode. Therefore, in the case of discharging a larger amount of surge current, a diode area is increased. Further, in electrostatic discharge protection device 100 of the related art, a trench oxide film is used for increasing a breakdown voltage of the diode, so an additional area is necessary for forming the trench oxide film. That is, the formation of the trench oxide film leads to an increase in area of the electrostatic discharge protection device 100. Moreover, if the surge current is discharged through the broken-down diode, the diode is deteriorated or broken down. The electrostatic discharge protection device needs to discharge a surge current to protect an internal circuit and protect circuit components against breakdown. If the circuit components are broken down, the following failure occurs. That is, a terminal potential is fixed to a potential of the VDD terminal or a leak current increases, for example.

SUMMARY

An electrostatic breakdown protection method according to an aspect of the present invention protects a semiconductor device from a surge current impressed between a first terminal and a second terminal, the semiconductor device including: a diode impressing a forward-bias current from the first terminal to the second terminal; and a bipolar transistor impressing a current in a direction from the second terminal to the first terminal under an ON state, a continuity between a collector terminal and an emitter terminal of the bipolar transistor being attained before a potential difference between the first terminal and the second terminal reaches such a level that the diode is broken down.

According to the electrostatic breakdown protection method of the present invention, the bipolar transistor starts operation before the diode is broken down, and discharges a surge current. Hence, a surge current can be discharged through the bipolar transistor operation. The surge current does not cause breakdown of the diode. If a large amount of surge current is discharged through a broken-down diode, there is a possibility that the diode is heated to cause breakdown of the diode. In contrast, in the case of discharging a surge current through the bipolar transistor operation, an on-resistance of the transistor is lower than that of the broken-down diode, so even if a large amount of surge current is impressed, an amount of heat generated with the bipolar transistor is small. That is, according to the electrostatic breakdown protection method of the present invention, an internal circuit of a semiconductor device can be protected from a larger surge current.

Further, an on-resistance of the bipolar transistor is small, so if the bipolar transistor is given a protection ability similar to that of the diode, the bipolar transistor can be provided in a smaller layout area than the diode.

According to another aspect of the invention, an electrostatic discharge protection device that protects a semiconductor device from a surge current impressed between a first power supply terminal or a second power supply terminal and an input/output terminal, includes: a first bipolar transistor having a collector terminal connected with the first power supply terminal, an emitter terminal connected with the input/output terminal, and a base terminal connected with the second power supply terminal; and a second bipolar transistor having a collector terminal connected with the second power supply terminal, an emitter terminal connected with the input/output terminal, and a base terminal connected with the first power supply terminal, one of the first and second bipolar transistors ensuring a continuity between the collector terminal and emitter terminal under such conditions that a potential difference between the first or second power supply terminal and the input/output terminal is lower than a breakdown voltage at a PN junction between the emitter terminal and the base terminal of the other bipolar transistor.

According to the electrostatic breakdown protection device of the present invention, one of the first and second bipolar transistors starts operation before the breakdown of the PN junction portion of the other bipolar transistor. Hence, a surge current can be discharged through the bipolar transistor operation. The surge current does not cause breakdown of the PN junction portion. If a large amount of surge current is discharged through a broken-down PN junction portion, there is a possibility that the PN junction portion is heated and broken down. In contrast, in the case of discharging a surge current through the bipolar transistor operation, an on-resistance of the transistor is lower than that of the broken-down PN junction portion, so even if a large amount of surge current is impressed, an amount of heat generated at the PN junction is small. That is, according to the electrostatic breakdown protection device of the present invention, an internal circuit of a semiconductor device can be protected from a larger surge current.

According to another aspect of the invention, an electrostatic discharge protection device that protects a semiconductor device from a surge current impressed between a first power supply terminal or a second power supply terminal and an input/output terminal, includes: a first bipolar transistor having a collector terminal connected with the first power supply terminal, an emitter terminal connected with the input/output terminal, and a base terminal connected with the second power supply terminal; and a second bipolar transistor having a collector terminal connected with the second power supply terminal, an emitter terminal connected with the input/output terminal, and a base terminal connected with the first power supply terminal, at least one of the first and second bipolar transistors including a buried region formed below and adjacent to an emitter region where the emitter terminal is formed, with the same conductivity type as the emitter region and an impurity concentration lower than an impurity concentration of the emitter region.

According to the electrostatic discharge protection device of the present invention, a buried region is formed below and adjacent to the emitter region of the first and second bipolar transistors, with the same conductivity type as the emitter region and an impurity concentration lower than that of the emitter region. Due to the buried region, an electric field between the emitter terminal and the base terminal can be controlled. Hence, a breakdown voltage at the PN junction between the emitter terminal and the base terminal can be increased. In this way, if a breakdown voltage at the PN junction increases and exceeds a starting voltage of the bipolar transistor, impressed surge current can be discharged through the bipolar transistor.

According to the electrostatic discharge protection method and device for a semiconductor device of the present invention, it is possible to protect an internal circuit from a larger surge current with high reliability of elements in a protective circuit and prevent a layout area from increasing.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
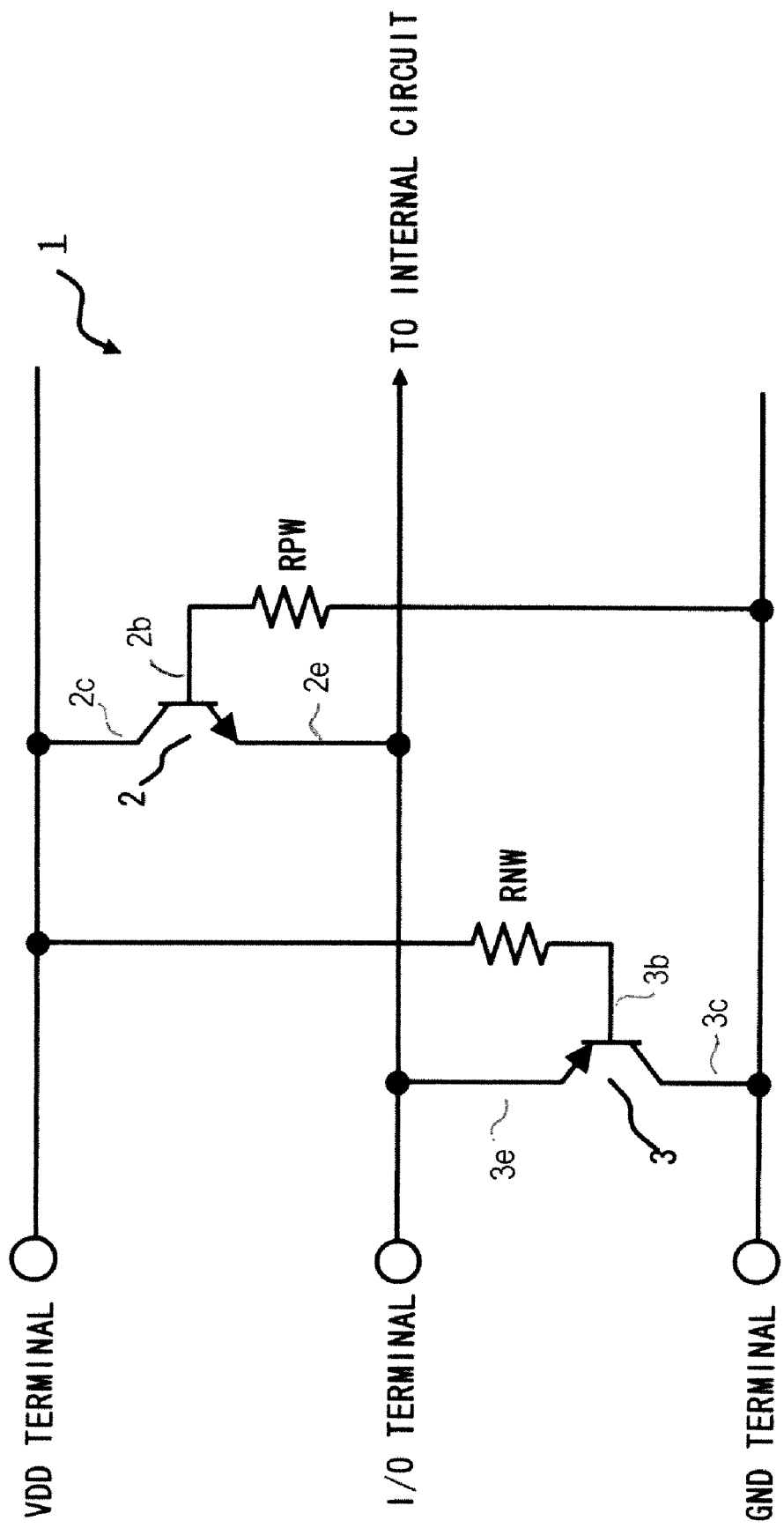
FIG. 1 is a circuit diagram of an electrostatic discharge protection device according to a first embodiment of the present invention.

Hereinafter, embodiments of the present invention are described with reference to the accompanying drawings. FIG. 1 is a circuit diagram of an electrostatic discharge protection device 1 according to a first embodiment of the present invention. As shown in FIG. 1, the electrostatic discharge protection device 1 of the first embodiment includes a first bipolar transistor (for example, NPN transistor 2) and a second bipolar transistor (for example, PNP transistor 3). Further, the electrostatic discharge protection device 1 includes a first power supply terminal (for example, power supply terminal; hereinafter referred to as "VDD terminal"), an input/output terminal (hereinafter referred to as "I/O terminal"), and a second power supply terminal (for example, ground terminal; hereinafter referred to as "GND terminal"). The I/O terminal is connected with an internal circuit of the semiconductor device. The internal circuit is a circuit including an NMOS transistor and a PMOS transistor, for instance.

The NPN transistor 2 has a collector terminal 2c connected with a VDD terminal, an emitter terminal 2e connected with the input/output terminal, and a base terminal 2b connected with a GND terminal. Further, the PNP transistor 3 has a collector terminal 3c connected with the GND terminal, an emitter terminal 3e connected with the I/O terminal, and a base terminal 3b connected with the VDD terminal. Incidentally, a resistor RPW connected between a base terminal of the NPN transistor 2 and the GND terminal is a parasitic resistance of a P-well region in a region where the NPN transistor 2 is formed. Further, a resistor RNW connected between the base of the PNP transistor 3 and the VDD terminal is a parasitic resistance in an N-well region in a region where the PNP transistor 3 is formed.

Operations of the electrostatic discharge protection device 1 of the first embodiment are described next. First, normal operations of the semiconductor device are described. In this case, a ground voltage is impressed to the GND terminal, and a power supply voltage of about 3.3 V is impressed to the VDD terminal, for example. Further, data signals are input/output to/from the I/O terminal. A signal voltage of the I/O terminal has the amplitude between the ground voltage level and the power supply voltage level. Here, if a voltage of the I/O terminal is at the ground voltage level, the emitter terminal of the PNP transistor 3 is at the ground voltage level, and the base terminal is at the power supply voltage level, so the PNP transistor does not operate. Further, the emitter terminal of the NPN transistor 2 is at the ground voltage level, and the base terminal is at the ground voltage level, so the NPN transistor 2 does not operate.

On the other hand, if the I/O terminal is at the power supply voltage, the emitter terminal of the PNP transistor 3 is at the power supply voltage level, and the base terminal is at the power supply voltage level, so the PNP transistor 3 does not operate. Further, the emitter terminal of the NPN transistor 2 is at the power supply voltage level, and the base terminal is at the ground voltage level, so the NPN transistor 2 does not operate. That is, under normal operations of the semiconductor device, the electrostatic discharge protection device 1 does not operate, so there is no influence on ordinary operations of the semiconductor device.

Next, description is given of operations of the electrostatic discharge protection device 1 at the time of impressing electrostatic charges to the semiconductor device. The electrostatic charges are impressed to a second terminal (for example, I/O terminal) as positive or negative charges based on the potential level of a first terminal (for example, VDD terminal or GND terminal). For example, if positive electrostatic charges are impressed to the GND terminal, a voltage of the I/O terminal is higher than a voltage of the GND terminal (hereinafter this condition is referred to as "GND+ condition"). If negative electrostatic charges are impressed to the GND terminal, a voltage of the I/O terminal is lower than a voltage of the GND terminal (hereinafter this condition is referred to as "GND− condition") If positive electrostatic charges are impressed to the VDD terminal, a voltage of the I/O terminal is higher than a voltage of the VDD terminal (hereinafter this condition is referred to as "VDD+ condition"). If negative electrostatic charges are impressed to the VDD terminal, a voltage of the I/O terminal is lower than a voltage of the VDD terminal (hereinafter this condition is referred to as "VDD− condition").

The electrostatic discharge protection device 1 of this embodiment discharges a surge current generated due to impressed electrostatic charges through a snap back operation of the transistor or forward-bias of a diode defined by a PN junction between the emitter terminal (e.g., 2e and 3e) and base terminal (e.g., 2b and 3b) of the transistor (hereinafter simply referred to as "diode"). The forward-bias of the diode means an operation of supplying a current from an anode to a cathode under such conditions that a voltage of an N-type semiconductor region of a diode (cathode) is higher than a voltage of a P-type semiconductor region (anode).

Further, the snap back operation is described next. If a potential difference between an emitter terminal and a collector terminal of a transistor increases with the base terminal opened, minority carriers are generated between the emitter terminal and the base terminal. As a result, a continuity between the collector terminal and the emitter terminal of the transistor is ensured. That is, a potential difference between the emitter terminal and the collector terminal, which is barely able to generate minority carriers enough to drive the transistor between the emitter terminal and the base terminal is a starting voltage of the transistor. The starting voltage is hereinafter referred to as "snap back voltage". Further, a transistor operation in a region activated in accordance with the snap back voltage is a snap back operation.

If the transistor starts the snap back operation, a potential difference between the emitter terminal and the collector terminal is lowered down to a breakdown voltage BVceo generated between the collector terminal and the emitter terminal. After that, a collector-emitter voltage increases in accordance with a current flowing between the collector terminal and the emitter terminal and a resistance in an on-state transistor (on-resistance). Then, a collector-emitter current increases, and if the transistor temperature is raised up to transistor breakdown temperature, the transistor is broken down.

On the other hand, under a reversely-biased state that a cathode voltage is higher than an anode voltage, if a reverse-bias voltage is increased, breakdown occurs also in a diode, and a current flows from the cathode to the anode (hereinafter this operation is referred to as "breakdown operation") Under such conditions, if a current not smaller than a breakdown current flows through the diode, a high resistance is involved in the diode. A large current flows through the high resistance, with the result that the diode is heated and the diode is broken down.

An on-resistance of the transistor during the snap back operation is lower than a resistance value of the diode during the breakdown operation. Further, the transistor and the diode are broken down at substantially the same temperature. Accordingly, a breakdown current of the transistor is larger than that of the diode.

Figure 2:
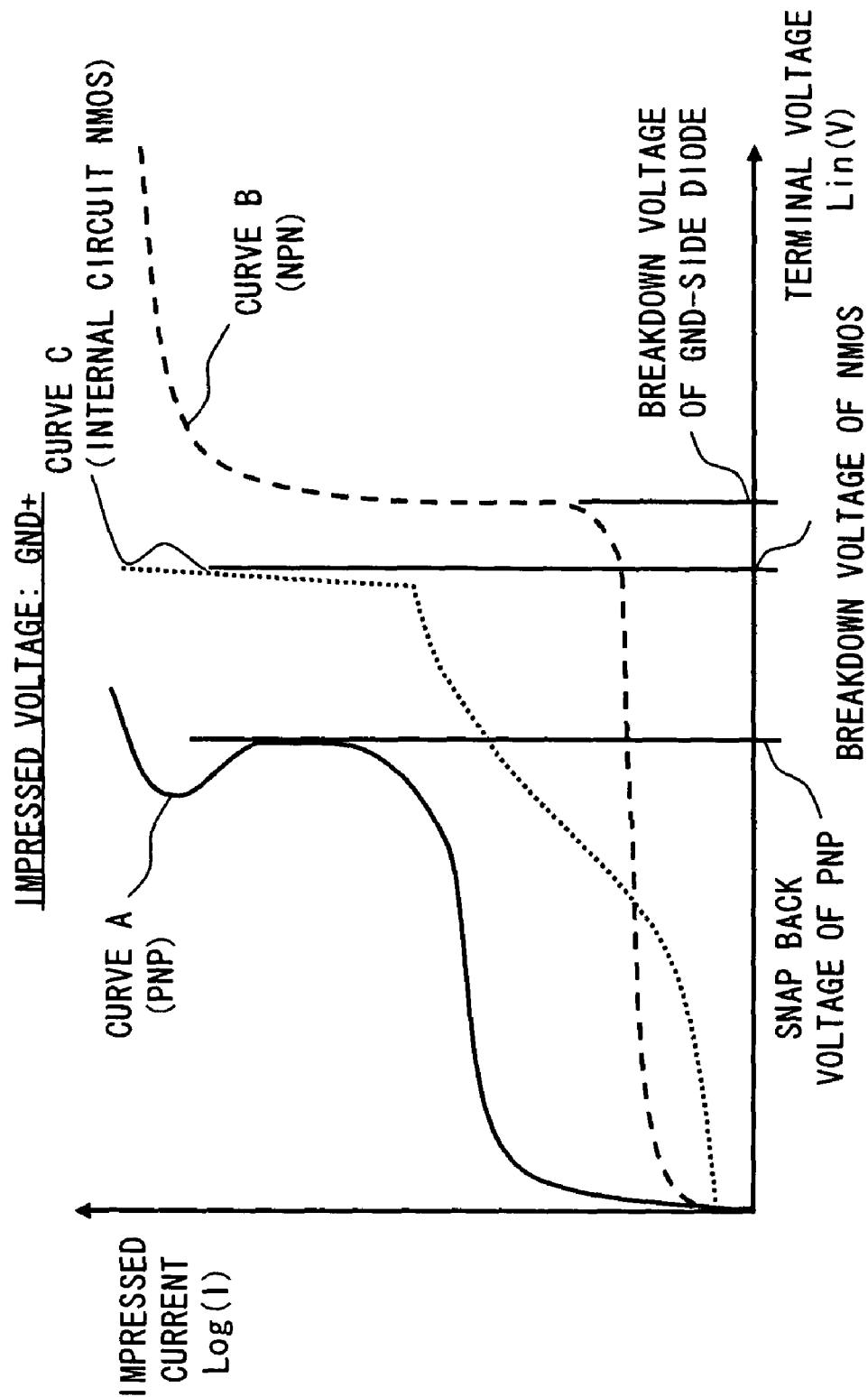
FIG. 2 is a graph showing current-voltage characteristics of an element upon impressing electrostatic charges under GND+ conditions in the electrostatic discharge protection device of the first embodiment.

Here, operations of the electrostatic discharge protection device 1 are described in detail in accordance with conditions for impressing electrostatic charges to the I/O terminal. First, description is made of the case of impressing electrostatic charges under the GND+ condition. Under this condition, a surge current flows from the I/O terminal into the GND terminal through the PNP transistor 3 since the PNP transistor 3 is turned on. In this embodiment, a snap back voltage of the PNP transistor 3 is set lower than a breakdown voltage of a diode formed between the emitter terminal and the base terminal of the NPN transistor NPN transistor 2 (hereinafter referred to as "breakdown voltage"). FIG. 2 shows current-voltage characteristics of the NPN transistor 2, the PNP transistor 3, and the NMOS transistor of the internal circuit under the GND+ condition. Incidentally, in the graph of FIG. 2, the vertical axis represents an absolute value of current impressed to the I/O terminal, and the horizontal axis represents an absolute value of a terminal voltage of the I/O terminal. Further, a curve A represents current-voltage characteristics of the PNP transistor 3, a curve B represents current-voltage characteristics of the NPN transistor 2, and a curve C represents current-voltage characteristics of the NMOS transistor.

As shown in FIG. 2, a snap back voltage of the PNP transistor 3 is lower than a breakdown voltage of the NMOS transistor and a breakdown voltage of the diode of the NPN transistor 2. Due to the characteristics, a surge current generated when electrostatic charges are impressed to the I/O terminal is discharged through the snap back operation of the PNP transistor 3 to prevent a potential difference between the I/O terminal and the GND terminal from increasing. Further, a potential difference between the I/O terminal and the GND terminal is prevented from increasing, so a diode of the NPN transistor 2 is not broken down, and almost no current flows through the diode.

Figure 3:
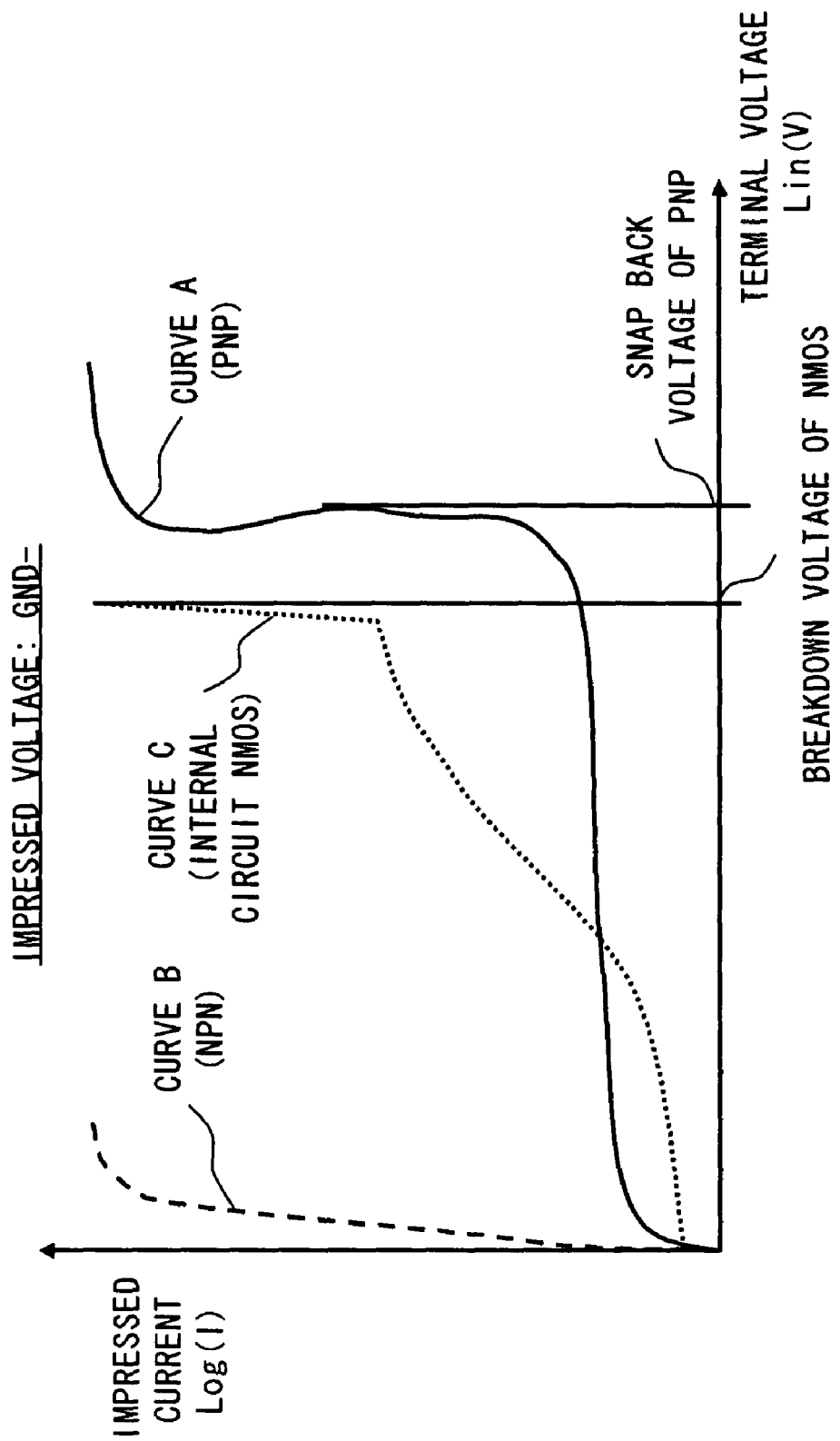
FIG. 3 is a graph showing current-voltage characteristics of an element upon impressing electrostatic charges under GND− conditions in the electrostatic discharge protection device of the first embodiment.

Description is given of an example where electrostatic charges are impressed under the GND− condition. A surge current in this condition flows into the I/O terminal from the GND terminal through the NPN transistor 2 due to a forward-bias current in the diode of the NPN transistor 2. FIG. 3 shows current-voltage characteristics of the NPN transistor 2, the PNP transistor 3, and the NMOS transistor of the internal circuit under the GND− condition. Incidentally, in the graph of FIG. 3, the vertical axis represents an absolute value of current impressed to the I/O terminal, and the horizontal axis represents an absolute value of a terminal voltage of the I/O terminal. Further, a curve A represents current-voltage characteristics of the PNP transistor 3, a curve B represents current-voltage characteristics of the NPN transistor 2, and a curve C represents current-voltage characteristics of the NMOS transistor.

As shown in FIG. 3, the current-voltage characteristics of the NPN transistor 2 show sharp gradient in accordance with the forward-bias of the diode. Further, a snap back voltage of the PNP transistor 3 is higher than a breakdown voltage of the NMOS transistor. Due to the characteristics, a surge current generated when electrostatic charges are impressed to the I/O terminal is discharged due to the forward-bias of the diode of the NPN transistor 2 to prevent a potential difference between the I/O terminal and the GND terminal from increasing. Since the potential difference between the I/O terminal and the GND terminal is prevented from increasing, so the snap back operation of the PNP transistor 3 does not occur and almost no current flows through the PNP transistor 3.

Figure 4:
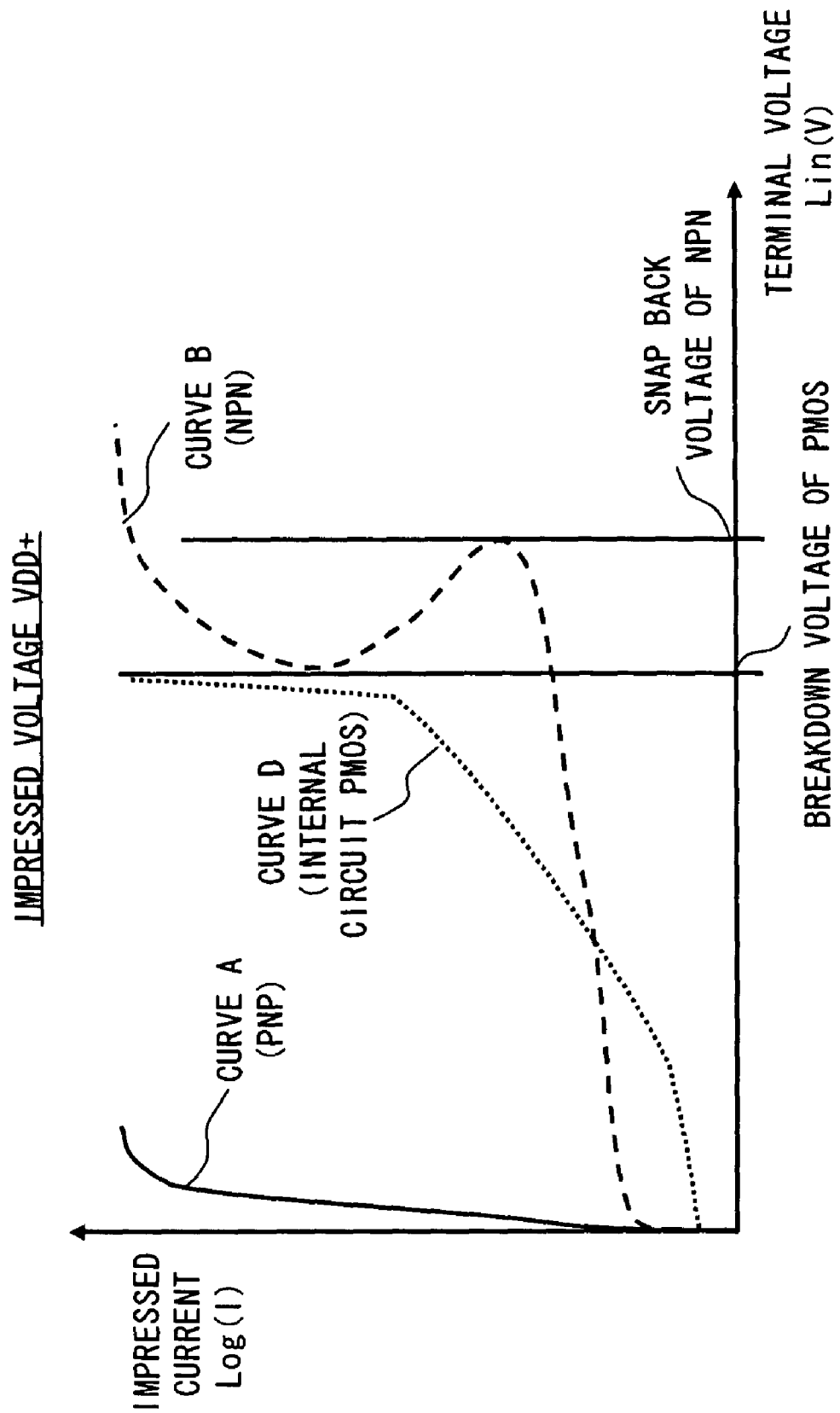
FIG. 4 is a graph showing current-voltage characteristics of an element upon impressing electrostatic charges under VDD+ conditions in the electrostatic discharge protection device of the first embodiment.

Description is given of an example where electrostatic charges are impressed under the VDD+ conditions. A surge current in this condition flows from the I/O terminal into the VDD terminal through the NPN transistor 3 in accordance with the forward-bias of the diode of the PNP transistor 3. FIG. 4 shows current-voltage characteristics of the NPN transistor 2, the PNP transistor 3, and the PMOS transistor of the internal circuit under the VDD+ conditions. Incidentally, in the graph of FIG. 4, the vertical axis represents an absolute value of current impressed to the I/O terminal, and the horizontal axis represents an absolute value of a terminal voltage of the I/O terminal. Further, a curve A represents current-voltage characteristics of a diode of the PNP transistor 3, a curve B represents current-voltage characteristics of the NPN transistor 2, and a curve D represents current-voltage characteristics of the PMOS transistor.

As shown in FIG. 4, the current-voltage characteristics of the PNP transistor 2 show sharp gradient in accordance with the forward-bias of the diode. Further, the snap back voltage of the NPN transistor 2 is higher than a breakdown voltage of the NMOS transistor. Due to the characteristics, a surge current generated when electrostatic charges are impressed to the I/O terminal is discharged in accordance with the forward-bias of the PNP transistor 3 to prevent a potential difference between the I/O terminal and the VDD terminal from increasing. Further, a potential difference between the I/O terminal and the VDD terminal is prevented from increasing, so the snap back operation of the NPN transistor 2 does not occur and almost no current flows through the NPN transistor 2.

Figure 5:
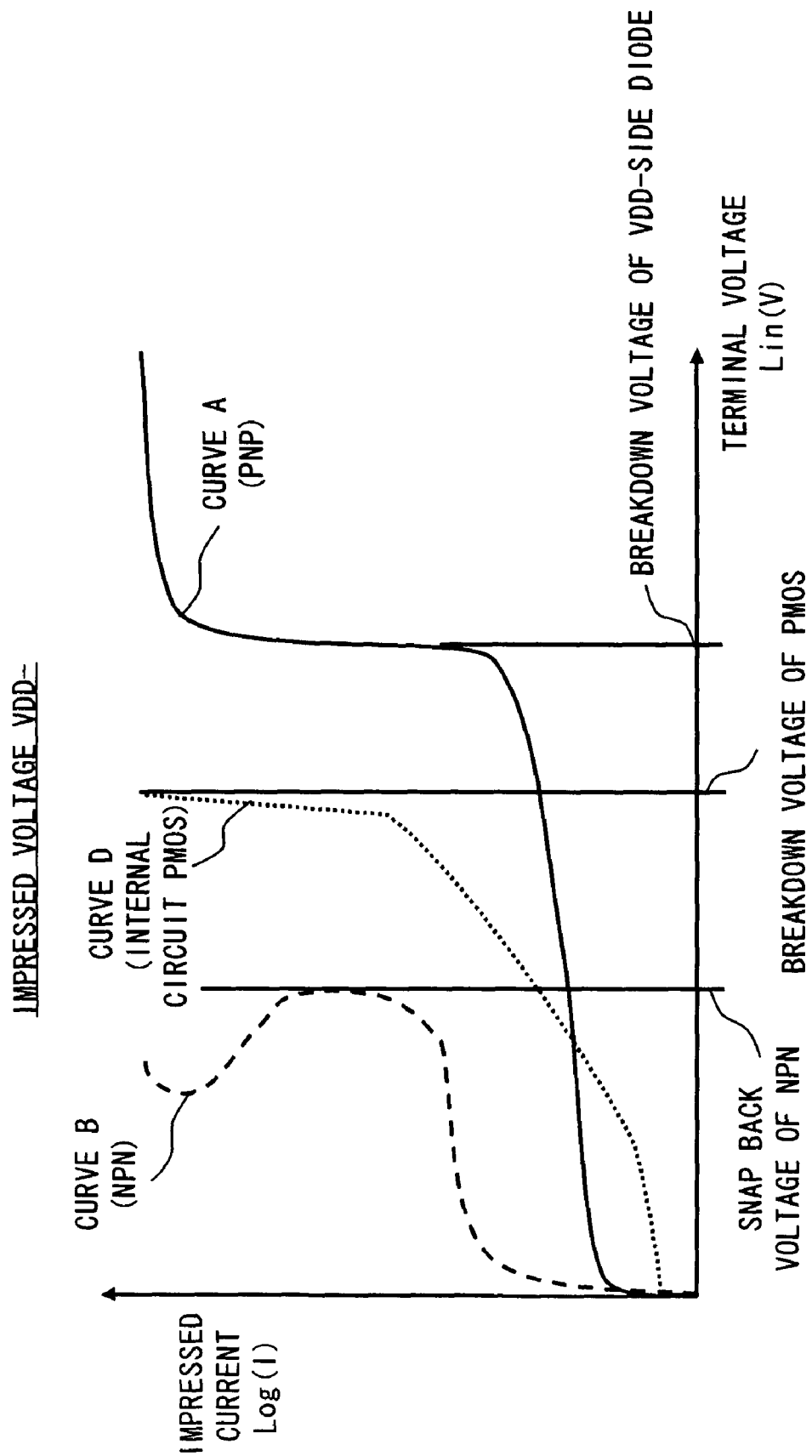
FIG. 5 is a graph showing current-voltage characteristics of an element upon impressing electrostatic charges under VDD− conditions in the electrostatic discharge protection device of the first embodiment.

Description is given of an example where electrostatic charges are impressed under the VDD– conditions. A surge current in this condition flows from the VDD terminal into the I/O terminal through the NPN transistor 2 since the NPN transistor 2 is turned on. In this embodiment, a snap back voltage of the NPN transistor 2 is set lower than a breakdown voltage of the diode of the PNP transistor. FIG. 5 shows current-voltage characteristics of the NPN transistor 2, the PNP transistor 3, and the NMOS transistor of the internal circuit under the VDD– conditions. Incidentally, in the graph of FIG. 5, the vertical axis represents an absolute value of current impressed to the I/O terminal, and the horizontal axis represents an absolute value of a terminal voltage of the I/O terminal. Further, a curve A represents current-voltage characteristics of the diode of the PNP transistor 3, a curve B represents current-voltage characteristics of the NPN transistor 2, and a curve D represents current-voltage characteristics of the PMOS transistor.

As shown in FIG. 5, a snap back voltage of the NPN transistor 2 is lower than a breakdown voltage of the NMOS transistor and a breakdown voltage of the diode of the PNP transistor 2. Due to the characteristics, a surge current generated when electrostatic charges are impressed to the I/O terminal under the VDD– conditions is discharged through the snap back operation of the NPN transistor 2 to prevent a potential difference between the I/O terminal and the VDD terminal from increasing. Further, a potential difference between the I/O terminal and the VDD terminal is prevented from increasing, so the diode of the PNP transistor 3 is not broken down, and almost no current flows into the diode.

As understood from the above description, in the electrostatic discharge protection device 1 of this embodiment, a snap back voltage of the transistor is set lower than a breakdown voltage of the diode formed at the PN junction between the emitter terminal and the base terminal of the transistor. Hence, the electrostatic discharge protection device 1 of this embodiment can discharge a surge current through the forward-biased diode and the transistor under the snap back operation without involving breakdown of the diode. Further, a surge current is discharged not through the broken-down diode. Thus, even if the transistor size is smaller than that of the related art, enough surge current discharge path can be obtained.

Further, temperature rise of elements can be suppressed during the snap back operation of the transistor as compared with during the breakdown of the diode. Thus, the electrostatic discharge protection device 1 of this embodiment can discharge a large amount of surge current compared with the case of discharging a surge current through the broken-down diode.

Figure 6:
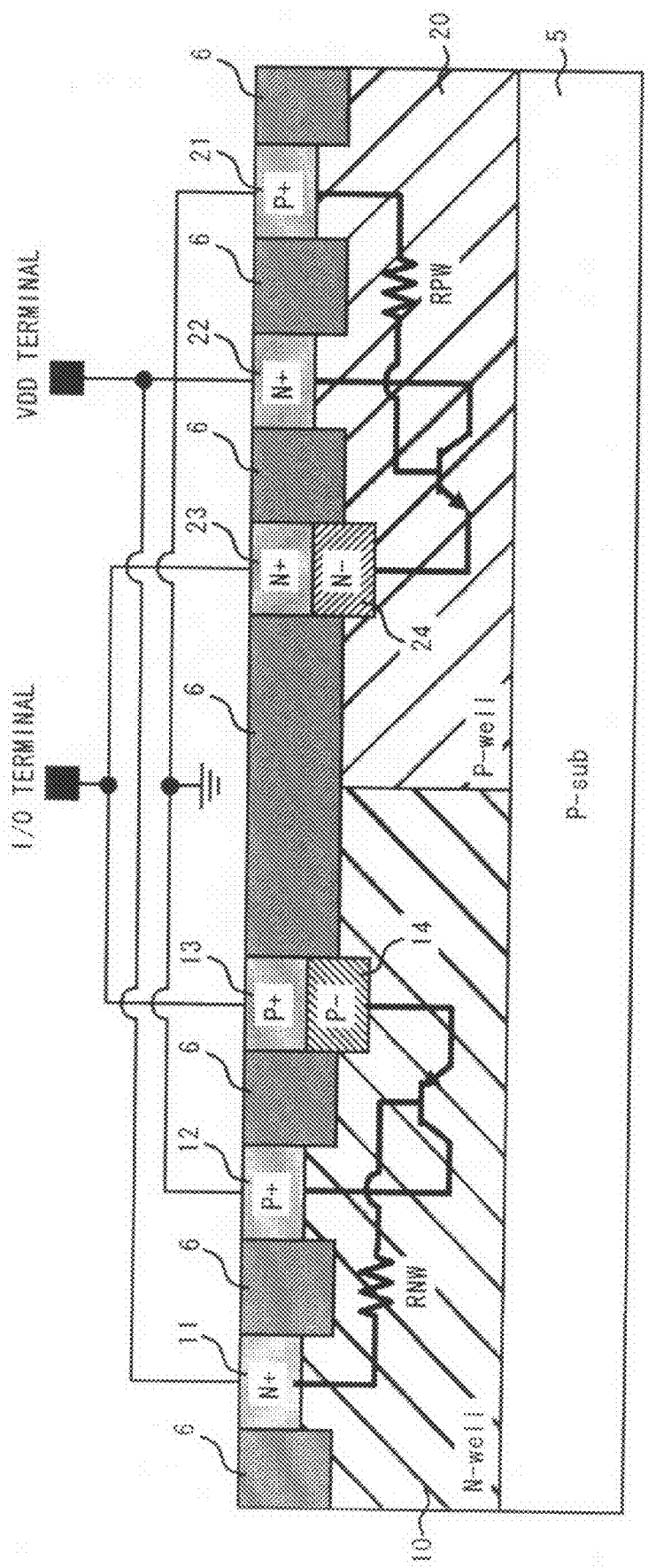
FIG. 6 is a sectional view of the electrostatic discharge protection device of the first embodiment.

Description is now given of the transistor structure where a snap back voltage of the transistor is set lower than a breakdown voltage of the diode defined between the emitter terminal and the base terminal of the transistor. FIG. 6 shows the electrostatic discharge protection device 1 of this embodiment in section.

As shown in FIG. 6, a P-well region 20 for forming the NPN transistor 2 and an N-well region 10 for forming the PNP transistor 3 are formed on a substrate region 5. The P-well region 20 is formed of a P-type semiconductor, and the N-well region 10 is formed of an N-type semiconductor.

A base region 21, a collector region 22, and an emitter region 23 are selectively formed on the P-well region 20. The base region 21 is made of a P-type semiconductor with an impurity concentration higher than that of the P-well region 20. The collector region 22 is made of an N-type semiconductor with an impurity concentration higher than that of the N-well region 10. The emitter region 23 is formed of an N-type semiconductor with an impurity concentration higher than that of the N-well region 10. Further, a region positioned below and adjacent to the emitter region 23 is formed of an N-type semiconductor, and a buried region (for example, LDDP region 24) with an impurity concentration lower than that of the emitter region 23 is formed in this region.

A base region 11, a collector region 12, and an emitter region 13 are selectively formed on the N-well region 10. The base region 11 is formed of an N-type semiconductor with an impurity concentration higher than that of the N-well region 10. The collector region 12 is formed of a P-type semiconductor with an impurity concentration higher than that of the P-well region 20. The emitter region 13 is formed of a P-type semiconductor with an impurity concentration higher than that of the P-well region 20. Further, a buried region (for example, LDDB region 14) which is made of a P-type semiconductor with an impurity concentration lower than that of the emitter region 13 is formed in a region below and adjacent to the emitter region 13. Incidentally, an insulative region 6 is formed in a portion above the N-well region 10 and the P-well region 20 except the base region, the collector region, and the emitter region.

As understood from the above description, in the electrostatic discharge protection device 1 of this embodiment, regions with an impurity concentration lower than that of the emitter region (LDDB region 14 and LDDP region 24) are formed below the emitter regions, making it possible to control an intensity of electric field generated between emitter region and the well region based on a voltage impressed to the emitter terminal. As a result, a breakdown voltage of a diode formed at the PN junction between the emitter terminal and the base terminal is set higher than a snap back voltage of the transistor. A breakdown voltage of the diode can be adjusted by changing an impurity concentration of the LDDB region 14 and LDDP region 24.

Figure 7:
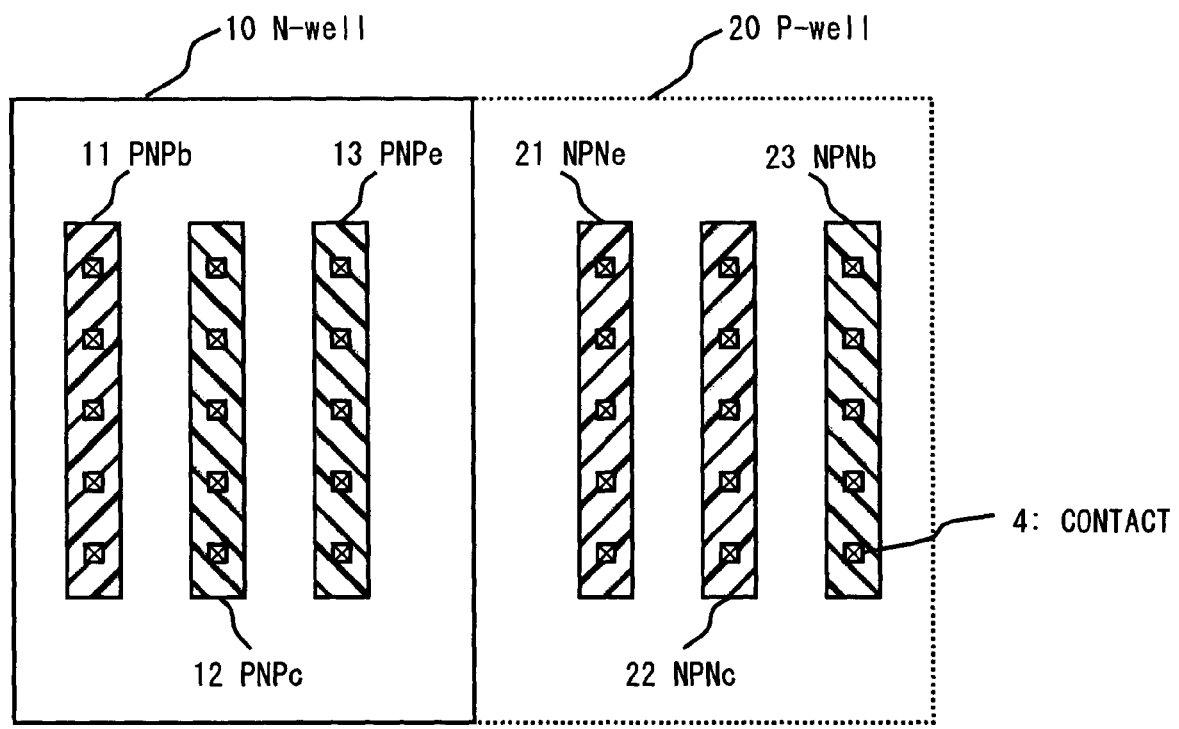
FIG. 7 shows a layout of the electrostatic discharge protection device of the first embodiment.

A manufacturing method of the electrostatic discharge protection device 1 is described next. FIG. 7 shows a layout of the electrostatic discharge protection device 1 as viewed from above. As shown in FIG. 7, the electrostatic discharge protection device 1 includes the N-well region 10 and the P-well region 20. In the N-well region 10, the base region 11, the collector region 12, and the emitter region 13 of the PNP transistor 3 are formed. In the P-well region 20, the base region 21, the collector region 22, and the emitter region 23 of the NPN transistor 2 are formed. Further, a contact hole 4 for connection with upper metal lines is formed in each of the base region, the collector region, and the emitter region.

Figure 8:
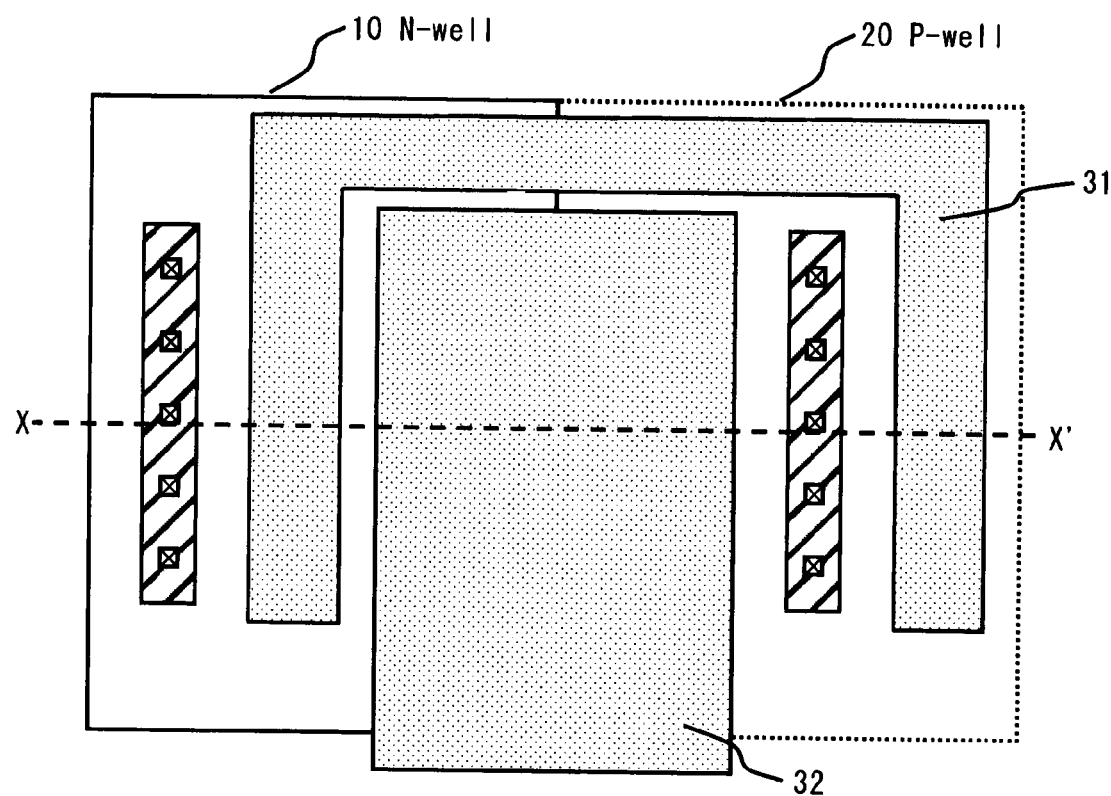
FIG. 8 shows a layout of the electrostatic discharge protection device of FIG. 7, on which a first metal line is formed.
Figure 9:
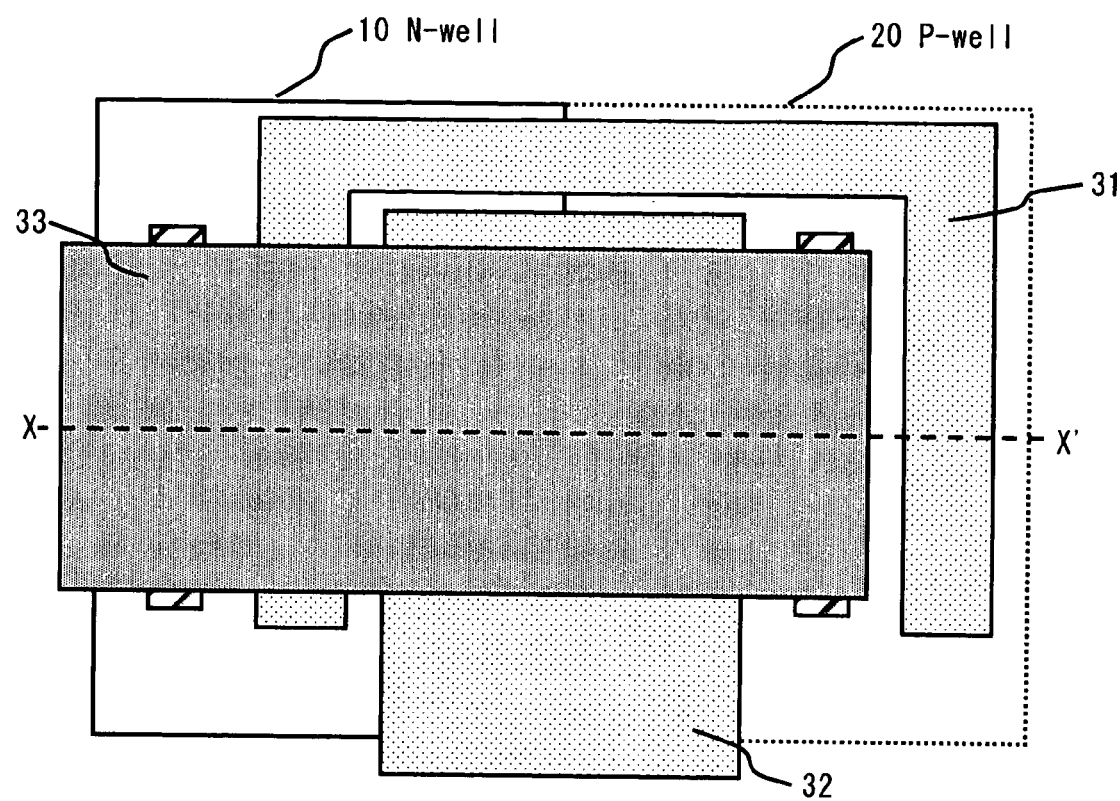
FIG. 9 shows a layout of the electrostatic discharge protection device of FIG. 7, on which first and second metal lines are formed.

FIG. 8 shows a layout where a first metal line is added to the layout of FIG. 7, and FIG. 9 shows a layout where a second metal line is added to the layout of FIG. 8. As shown in FIGS. 8 and 9, the terminals of the electrostatic discharge protection device 1 are connected together through the two metal lines.

For example, the base region 21 of the NPN transistor 2 and the collector region 12 of the PNP transistor 3 are connected through the first metal line 31. Although not shown, the metal line 31 is connected with the GND terminal. The emitter region 23 of the NPN transistor 2 and the emitter region 23 of the PNP transistor 3 are connected through the first metal line 32. Although not shown, the metal line 32 is connected to the I/O terminal. The collector region 22 of the NPN transistor 2 and the base region 11 of the PNP transistor 3 are connected through the second metal line 33. Although not shown, the metal line 32 is connected with the VDD terminal.

Figure 10:
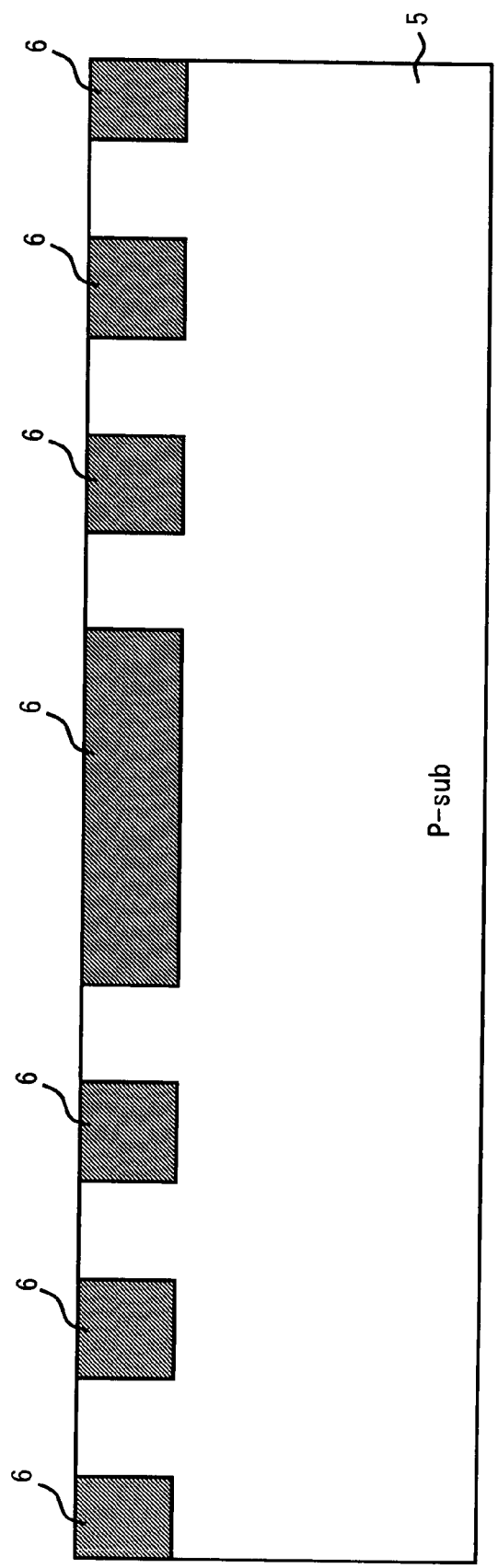
FIG. 10 is a sectional view of the electrostatic discharge protection device of the first embodiment, which has been completed up to a first step.

Referring to the X-X' sectional view of FIG. 9, the manufacturing method of the electrostatic discharge protection device 1 is described in detail next. FIG. 10 is a sectional view of the electrostatic discharge protection device 1 that has been completed up to a first step. In the first step, a trench is selectively formed in a P-type semiconductor layer on the substrate region, and an insulator such as an oxide film is filled into the trench to thereby form the insulative region 6.

Figure 11:
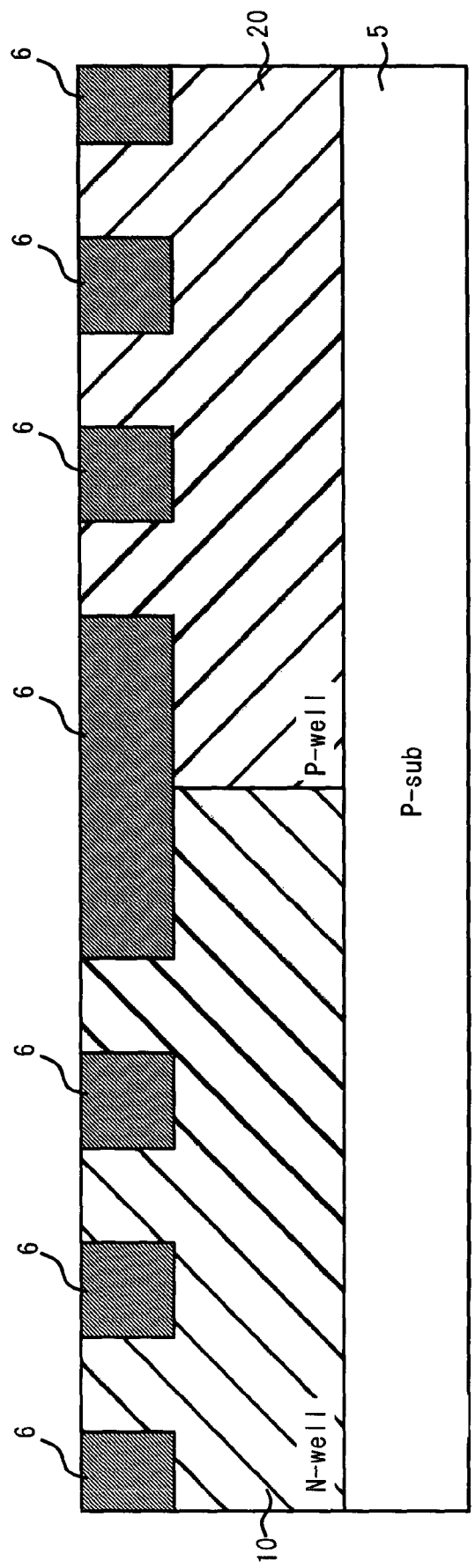
FIG. 11 is a sectional view of the electrostatic discharge protection device of the first embodiment, which has been completed up to a second step.

FIG. 11 is a sectional view of the electrostatic discharge protection device 1 that has been completed up to a second step. As shown in FIG. 11, in the second step, the N-well region 10 and the P-well region 20 are formed. The shapes of the N-well region 10 and the P-well region 20 are determined through patterning; the patterning step selectively impresses a resist with a mask. Based on the patterning, impurities are injected into a predetermined region to thereby form the N-well region 10 and the P-well region 20. In the case of forming the N-well region 10, for example, phosphorous ions are implanted. Further, in the case of forming the P-well region 20, for example, boron ions are implanted.

Figure 12:
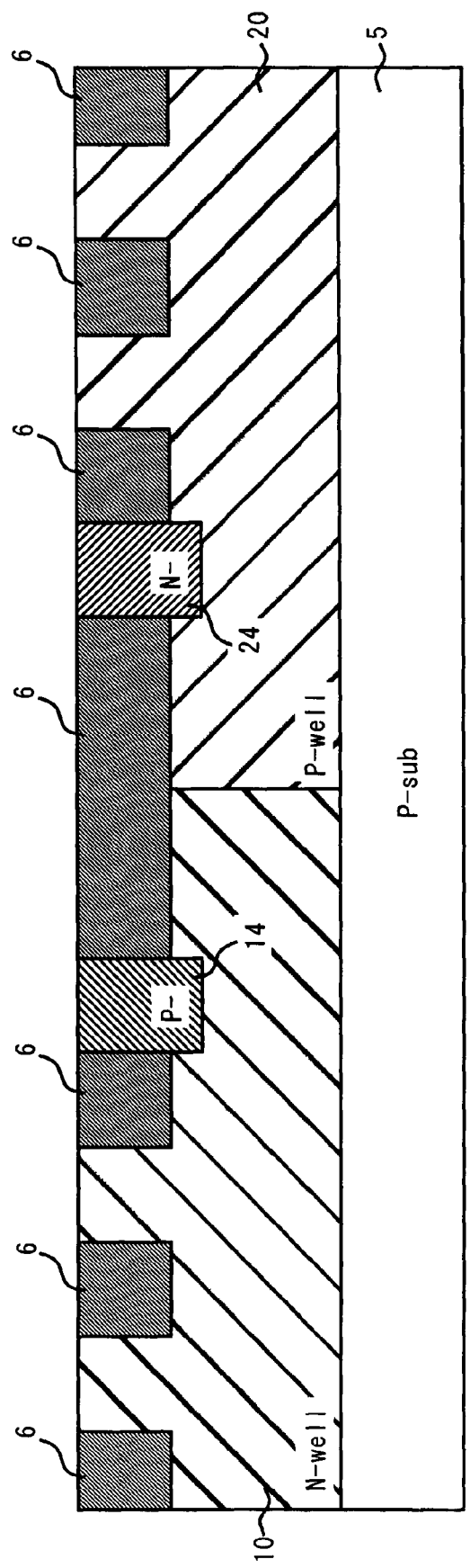
FIG. 12 is a sectional view of the electrostatic discharge protection device of the first embodiment, which has been completed up to a third step.

FIG. 12 is a sectional view of the electrostatic discharge protection device 1 that has been completed up to a third step. As shown in FIG. 12, in the third step, low-concentration regions for increasing a breakdown voltage of the diode (LDDB region 14 and LDDP region 24) are formed. In the LDDB region 14, the emitter region 13 of the PNP transistor 3 is formed. The LDDB region 14 is formed in a deeper portion than the emitter region 13. The LDDB region 14 is obtained by implanting, for example, boron ions. In the LDDP region 24, the emitter region 23 of the PNP transistor 2 is formed. The LDDP region 24 is formed in a deeper portion than the emitter region 23. The LDDP region 24 is obtained by implanting, for example, phosphorous ions. Here, the impurity concentration of the LDDB region 14 and the LDDP region 24 is substantially equal to that of the N-well region 10 and the P-well region 20.

Figure 13:
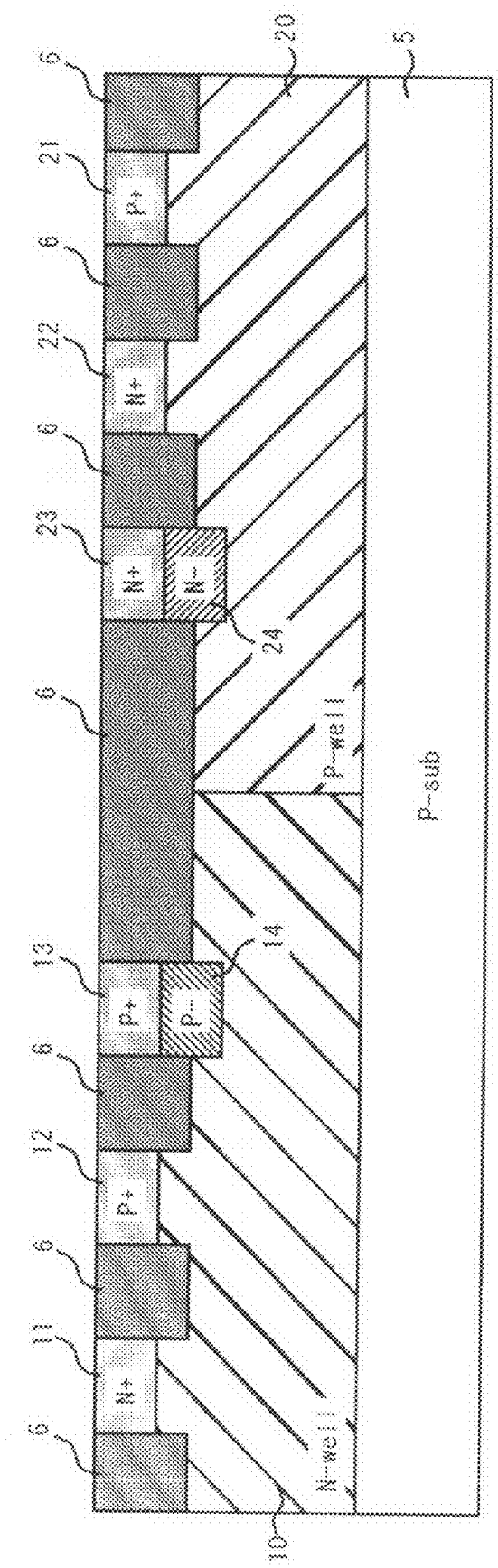
FIG. 13 is a sectional view of the electrostatic discharge protection device of the first embodiment, which has been completed up to a fourth step.

FIG. 13 is a sectional view of the electrostatic discharge protection device 1 that has been completed up to a fourth step. As shown in FIG. 13, in the fourth step, the base region, the collector region, and the emitter region are formed. The base region 21 of the NPN transistor 2 and the collector region 12 and emitter region 13 of the PNP transistor 3 are obtained by implanting boron ions. A concentration of doped impurities is higher than an impurity concentration of the P-well region 20. On the other hand, the collector region 22 and emitter region 23 of the NPN transistor 2 and the base region 11 of the PNP transistor 3 are obtained by implanting arsenic ions. A concentration of doped impurities is higher than an impurity concentration of the N-well region 10. A region formed through the first to fourth steps is hereinafter referred to as "element region".

Figure 14:
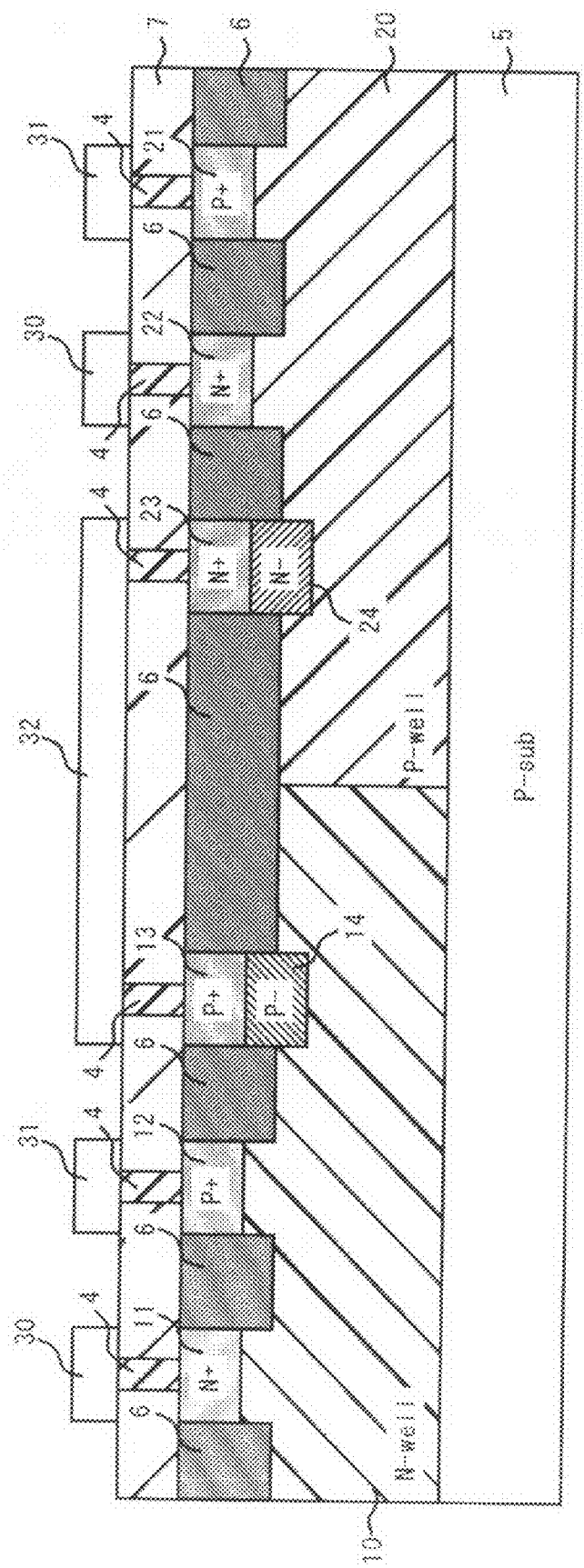
FIG. 14 is a sectional view of the electrostatic discharge protection device of the first embodiment, which has been completed up to a fifth step.

FIG. 14 is a sectional view of the electrostatic discharge protection device 1 that has been completed up to a fifth step. As shown in FIG. 14, in the fifth step, the interlayer film 7, the contact 4, and the first metal lines 30 and 31 are formed. The interlayer film 7 is formed to cover the element region surface. The contact 4 is passed through the interlayer film 7 to expose the base region, the collector region, and the emitter region. The contact 4 is obtained by filling a metal material into a trench formed in the interlayer film 7. The first metal lines 31 and 32 are laid down in accordance with a connection form of elements in the electrostatic discharge protection device 1, and are formed on the surface of the interlayer film 7. Further, the first metal line 30 partially connects between the second metal line and the contact 4.

Figure 15:
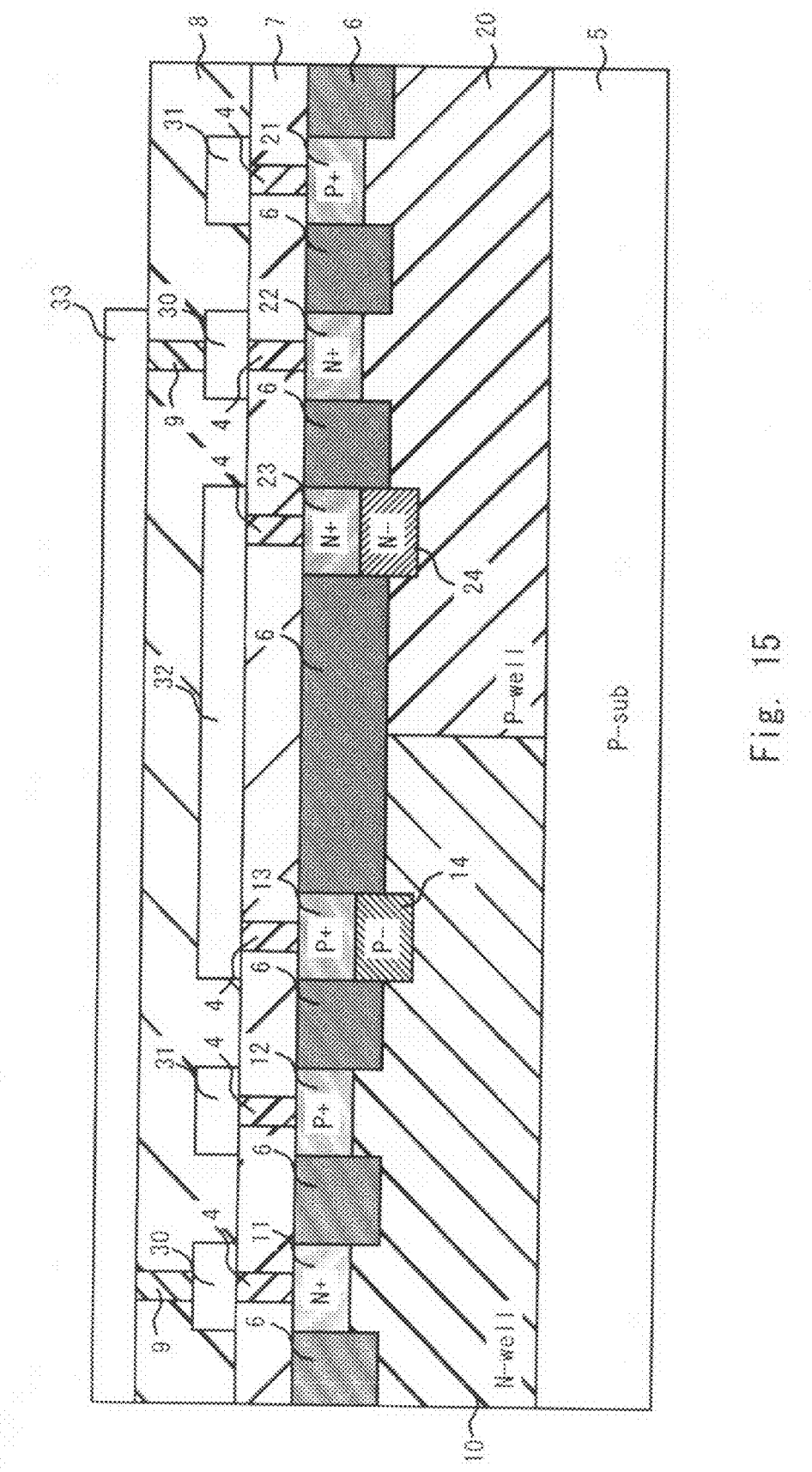
FIG. 15 is a sectional view of the electrostatic discharge protection device of the first embodiment, which has been completed up to a sixth step.

FIG. 15 is a sectional view of the electrostatic discharge protection device 1 that has been completed up to a sixth step. As shown in FIG. 15, in the sixth step, an interlayer film 8, via-hole 9, and a second metal line 33 are formed. The interlayer film 8 is formed to insulate the first metal line from the second metal line. The via-hole 9 connects between the first metal line and the second metal line. The via-hole 9 is obtained by filling a metal material into a hole passed through the interlayer film 8 to expose the first metal line surface. The second metal line 33 is formed on the interlayer film 8.

Through the first to sixth steps, the electrostatic discharge protection device 1 of this embodiment can be manufactured. Further, the above steps may be steps in a manufacturing process of a MOS transistor. In this case, an internal circuit can be protected against breakdown by the electrostatic discharge protection device 1 of this embodiment even in a circuit composed of MOS transistors the breakdown voltage of which is low. Incidentally, the manufacturing process including above steps is an example of a manufacturing method, and the manufacturing method of the electrostatic discharge protection device 1 of this embodiment is not limited thereto.

Figure 16:
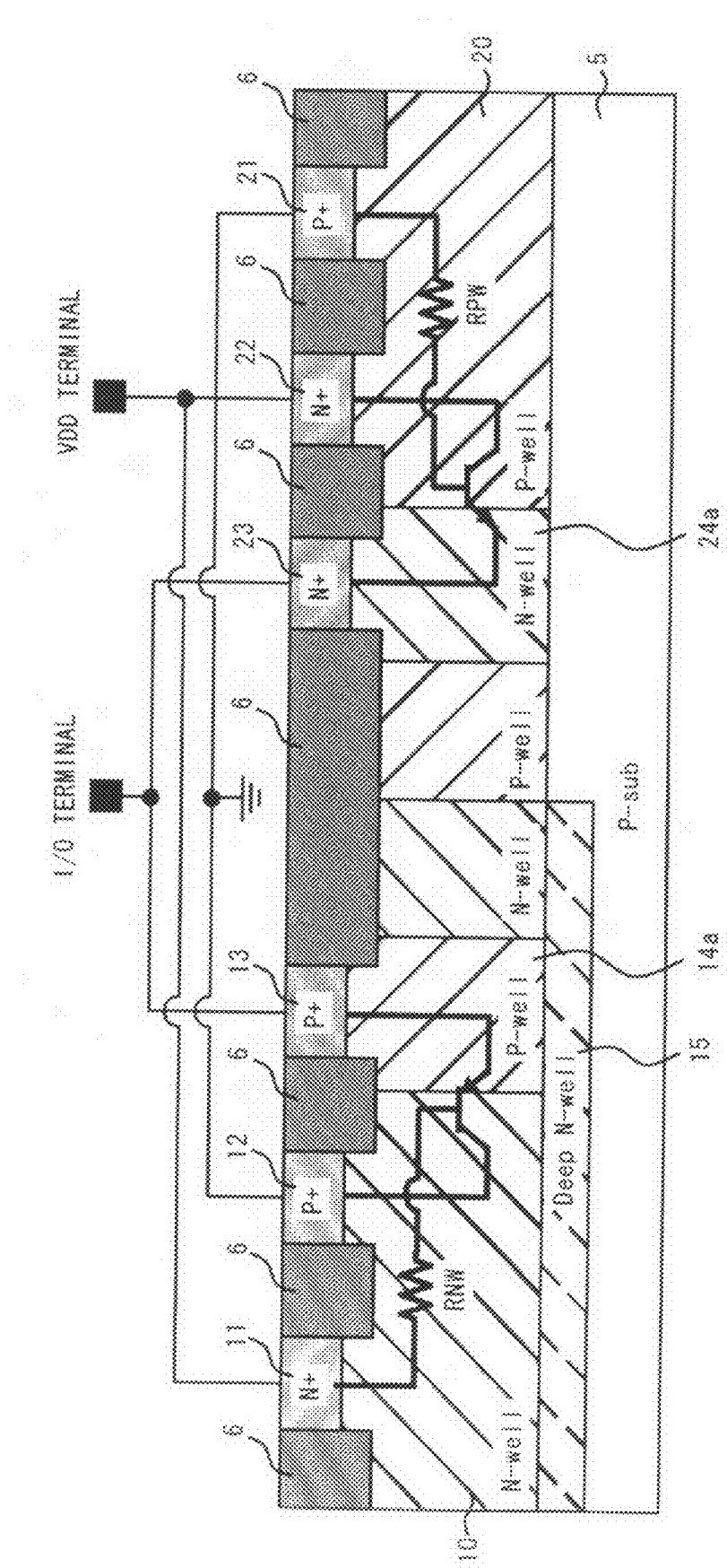
FIG. 16 is a sectional view of an electrostatic discharge protection device according to a first modified example of the first embodiment.

A sectional structure of the electrostatic discharge protection device 1 of this embodiment device 1 manufactured by another electrostatic discharge protection method is described next. First, a first modified example is explained. FIG. 16 is a sectional view of the electrostatic discharge protection device 1 of the first modified example. As shown in FIG. 16, the electrostatic discharge protection device of the first modified example includes a P-well region 14a and an N-well region 24a in place of the LDDB region 14 and the LDDP region 24. In this case as well, a region with an impurity concentration lower than that of the emitter region is formed between the emitter region and the base region. Thus, a breakdown voltage of a diode formed between the base terminal and the emitter terminal can be increased. Incidentally, in the first modified example, a deep N-well region 15 is formed below the region where the PNP transistor 3 is formed, for the purpose of insulating the P-well region 14a below the emitter region 13 from the substrate region 5.

Figure 17:
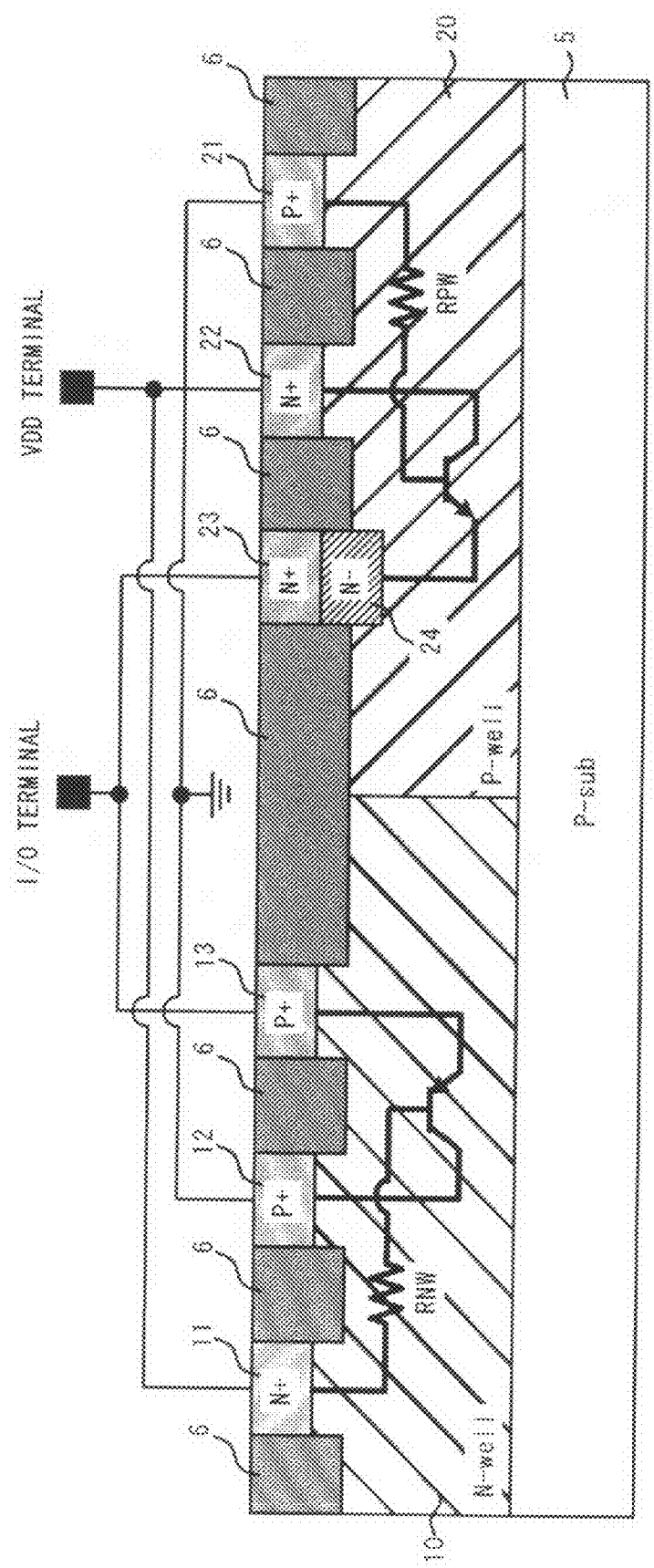
FIG. 17 is a sectional view of an electrostatic discharge protection device according to a second modified example of the first embodiment.
Figure 18:
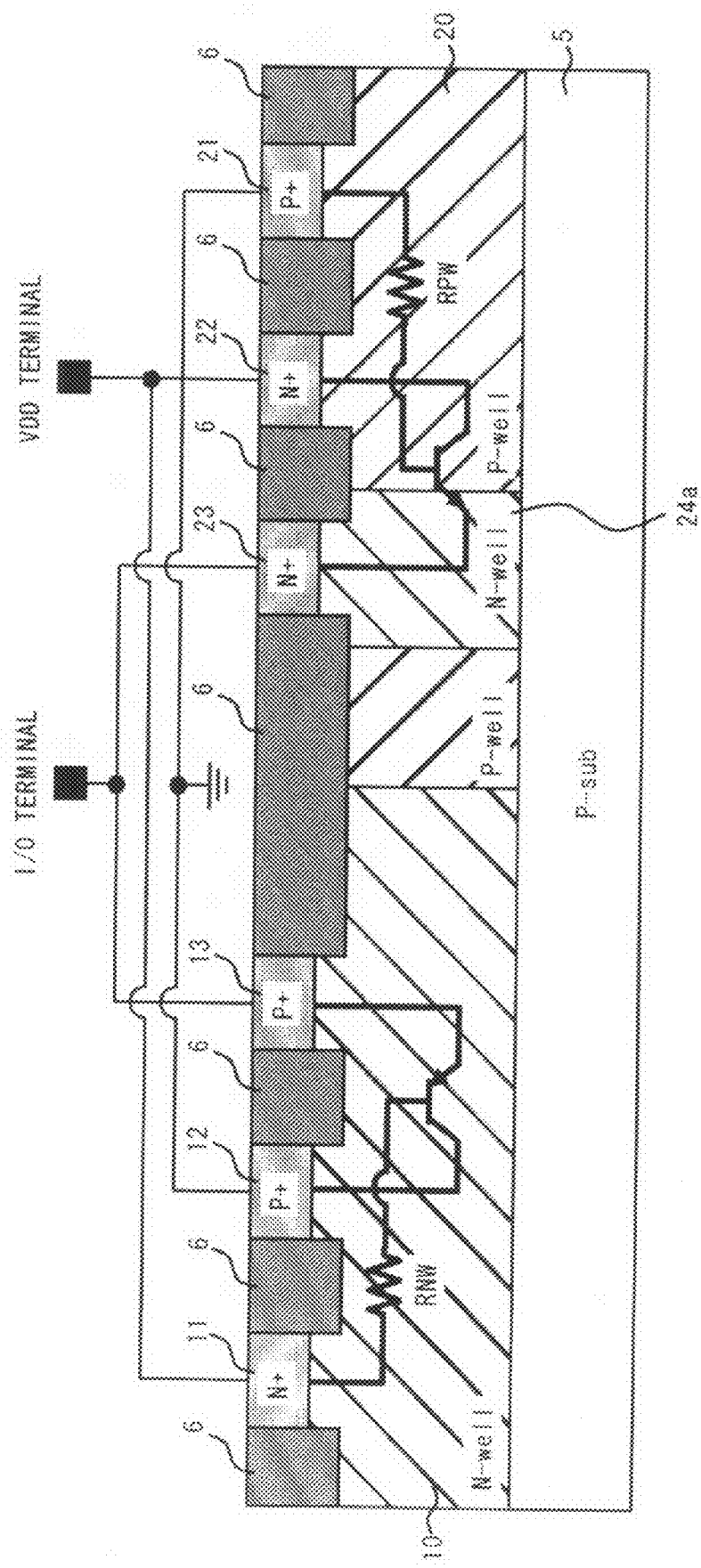
FIG. 18 is a sectional view of another example of the electrostatic discharge protection device according to the second modified example of the first embodiment.

A second modified example is described next. The electrostatic discharge protection device 1 of the second modified example is intended for use under such conditions that a breakdown voltage between the emitter region 13 of the PNP transistor 3 and the N-well region 10 is high. FIG. 17 is a sectional view of the electrostatic discharge protection device 1 in this case. As shown in FIG. 17, the electrostatic discharge protection device 1 of the second modified example only includes the LDDP region 24 as a low-concentration region adjacent to the emitter region. In the second modified example as well, the LDDP region 24 may be replaced by the N-well region 24a. FIG. 18 is a sectional view of the electrostatic discharge protection device 1 including the N-well region 24a in place of the LDDP region 24.

Figure 19:
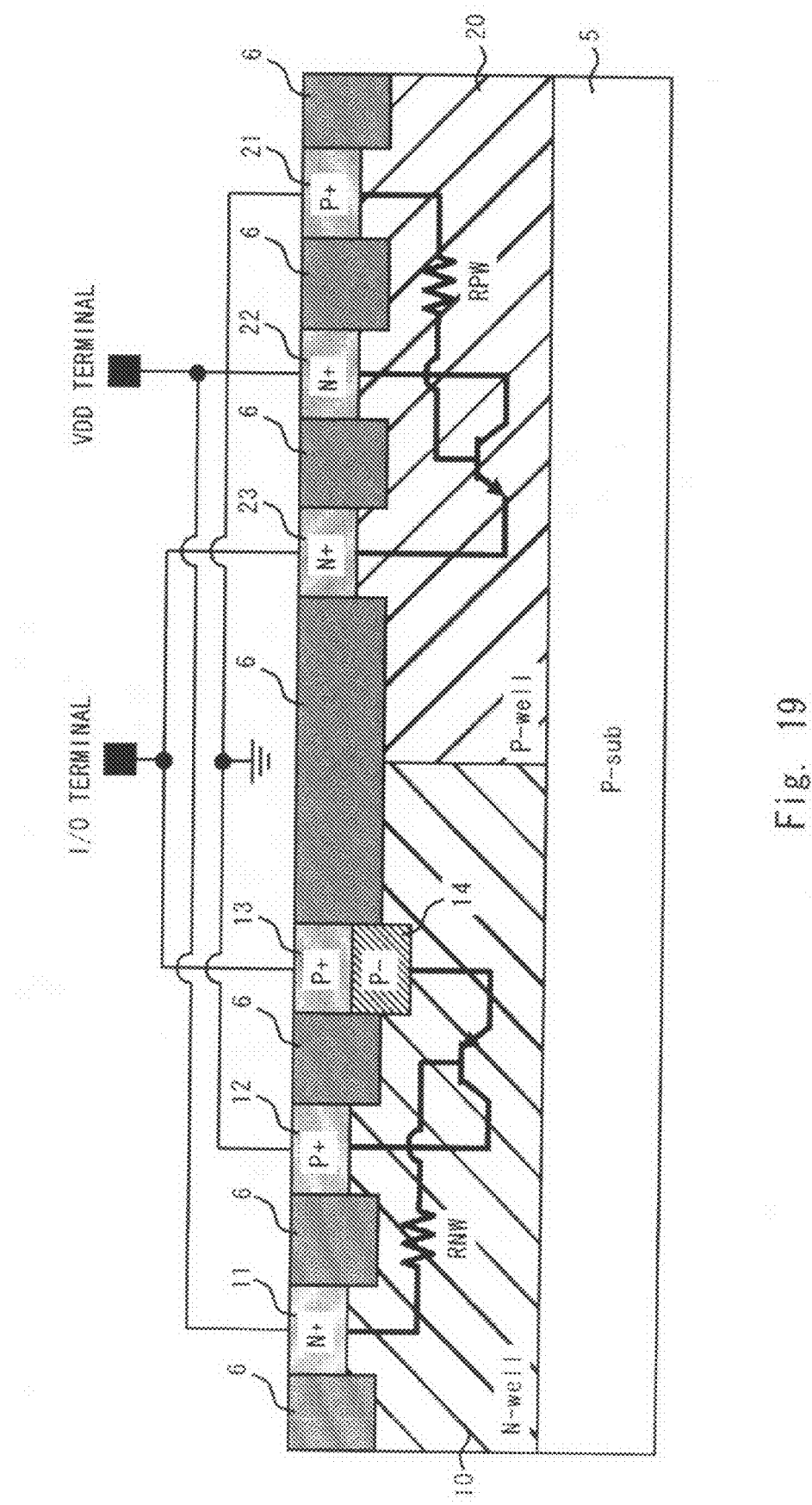
FIG. 19 is a sectional view of an electrostatic discharge protection device according to a third modified example of the first embodiment.
Figure 20:
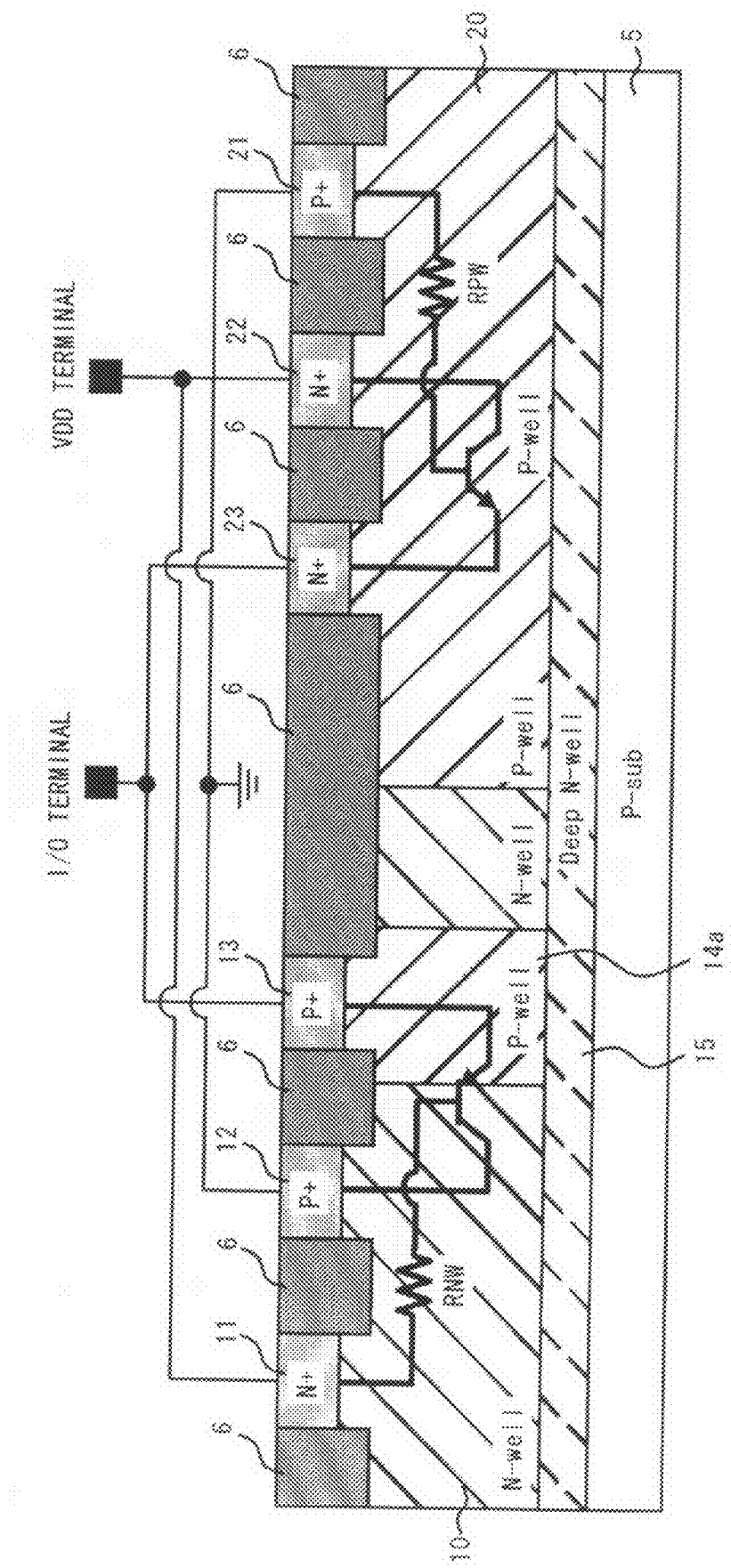
FIG. 20 is a sectional view of another example of the electrostatic discharge protection device according to the third modified example of the first embodiment.

A third modified example is described. The electrostatic discharge protection device 1 of the third modified example is intended for use under such conditions that a breakdown voltage between the emitter region 23 of the NPN transistor 2 and the P-well region 20 is high. FIG. 19 is a sectional view of the electrostatic discharge protection device 1 in this case. As shown in FIG. 19, the electrostatic discharge protection device 1 of the third modified example only includes the LDDB region 14 as a low-concentration region adjacent to the emitter region. In the third modified example as well, the LDDB region 14 may be replaced by the P-well region 14a. FIG. 20 is a sectional view of the electrostatic discharge protection device 1 including the P-well region 14a in place of the LDDB region 14. Incidentally, as shown in FIG. 20, the deep N-well region 15 may be formed below a region where the NPN transistor 2 is formed as well as the region where the PNP transistor 3 is formed.

Second Embodiment

A electrostatic discharge protection device 1a according to a second embodiment of the present invention differs from the electrostatic discharge protection device 1 of the first embodiment in that a resistance value of the parasitic resistance (resistor RNW and resistor RPW) formed in the well region is substantially increased. If a resistance value of the parasitic resistance is increased, after the breakdown of a diode between the emitter terminal and the base terminal, a potential difference between the I/O terminal and the VDD terminal or GND terminal can be increased in accordance with an amount of surge current. By increasing the potential difference, even if a breakdown operation of the diode precedes the snap back operation of the transistor, the transistor starts the snap back operation before the diode is broken down.

For example, if a breakdown voltage of the diode largely fluctuates due to variations in manufacturing step, it is effective to substantially increase resistance values of the resistor RNW and the resistor RPW.

Figure 21:
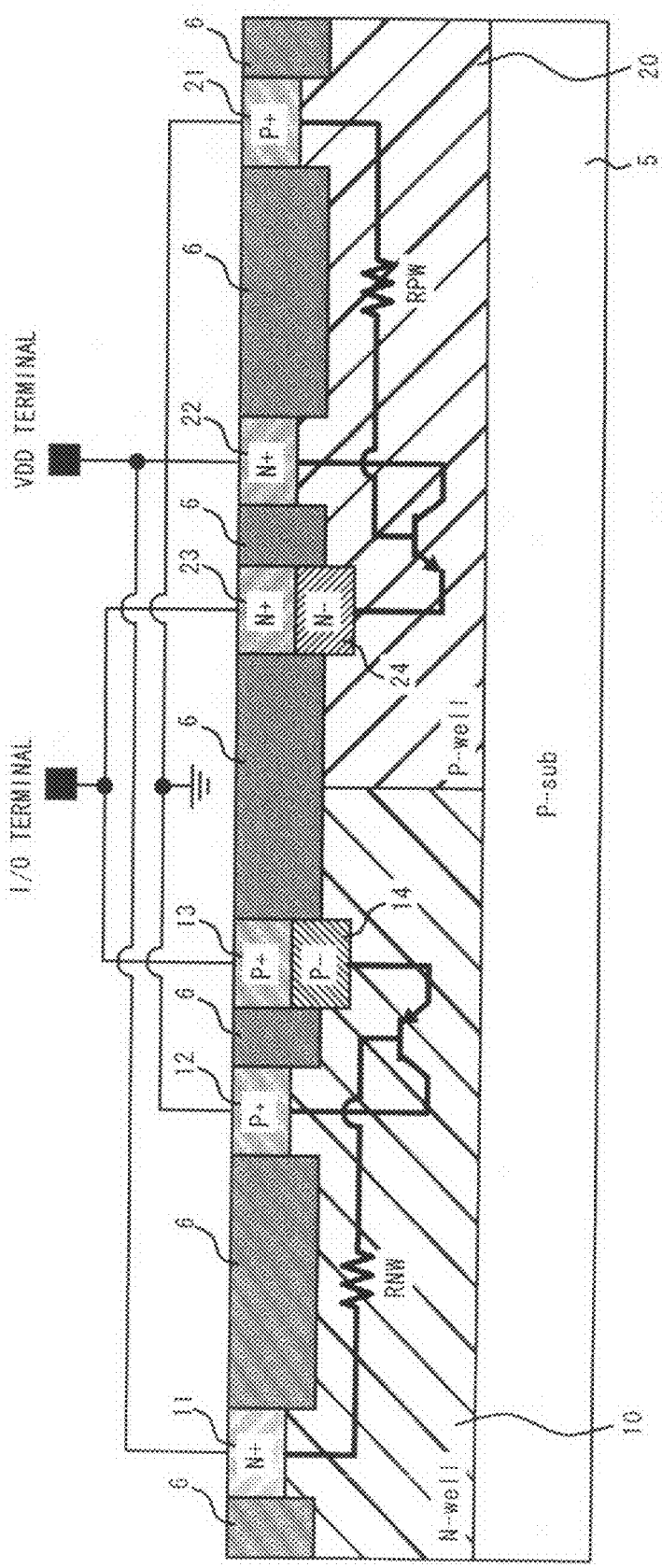
FIG. 21 is a sectional view of an electrostatic discharge protection device according to a second embodiment of the present invention.

FIG. 21 is a sectional view of an example of the electrostatic discharge protection device 1a where resistance values of the resistor RNW and the resistor RPW are set substantially large. As shown in FIG. 21, in the electrostatic discharge protection device 1a of this example, a distance between the emitter region and the base region is larger than that in the electrostatic discharge protection device 1 of the first embodiment. Thus, a length of the N-well region 10 formed between the emitter region and the base region is increased, so resistance values of the resistor RNW and the resistor RPW increase.

Figure 22:
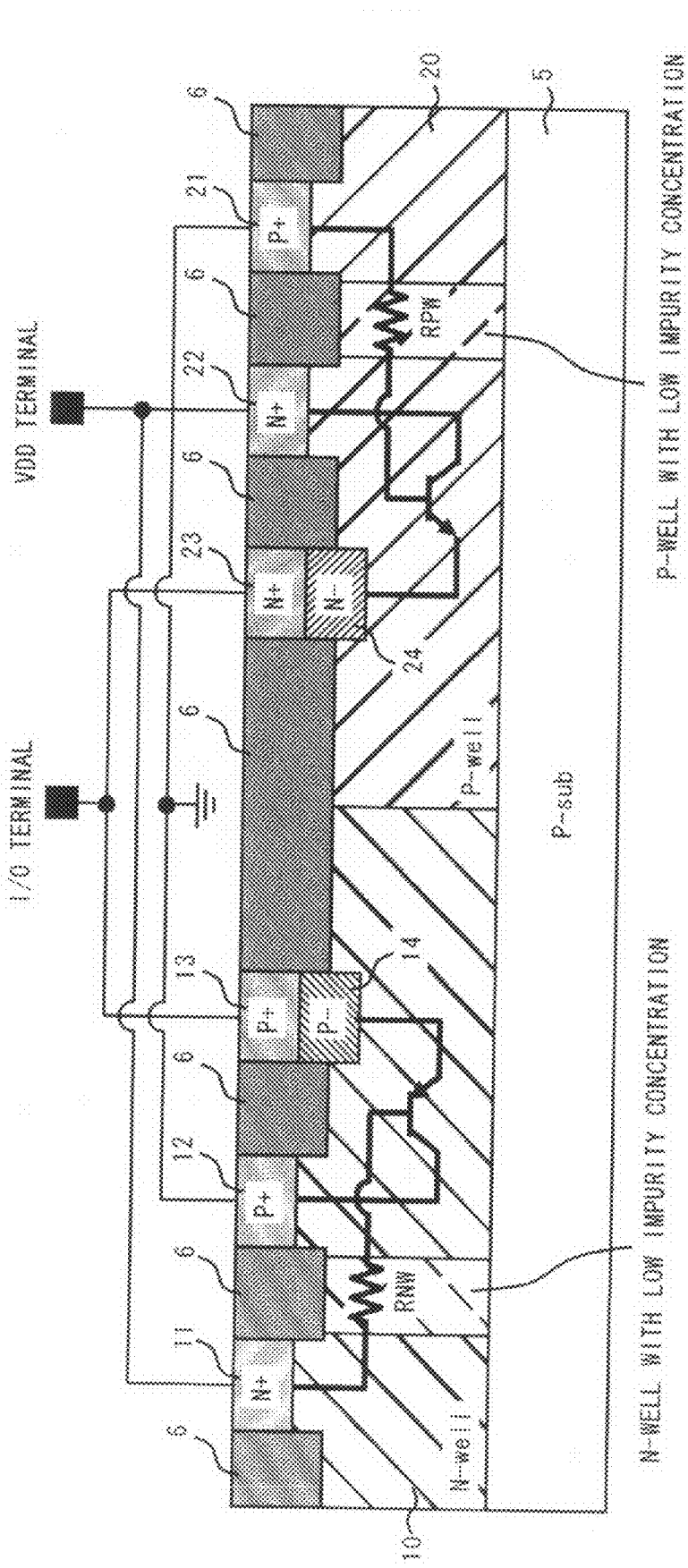
FIG. 22 is a sectional view of an electrostatic discharge protection device according to a first modified example of the second embodiment.

Further, FIG. 22 is a sectional view of a first modified example of the second embodiment. In the electrostatic discharge protection device 1a of the first modified example of the second embodiment, a distance of the emitter region and the base region is the same as that of the first embodiment. In the first modified example of the second embodiment, a well region having a low impurity concentration is formed in a region between the collector region and the base region. The well region with the low impurity concentration is formed of a semiconductor having the same conductivity type as that of its surrounding well regions. A resistance value of the well region with the low impurity concentration is larger than that of the surrounding well regions. Thus, the resistance value of the resistor RNW and resistor RPW can be increased by forming the well region with the low impurity concentration.

Figure 23:
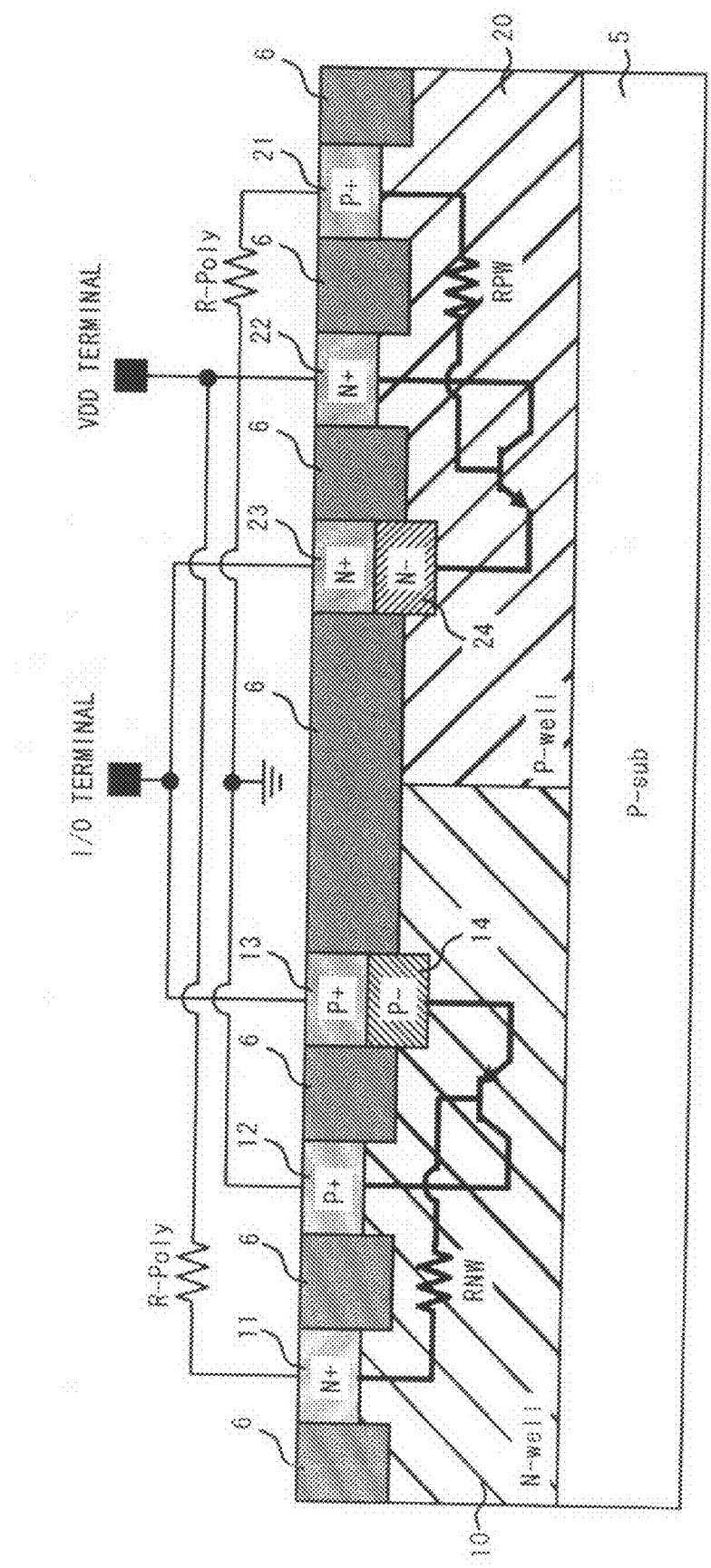
FIG. 23 is a sectional view of an electrostatic discharge protection device according to a second modified example of the second embodiment.
Figure 24:
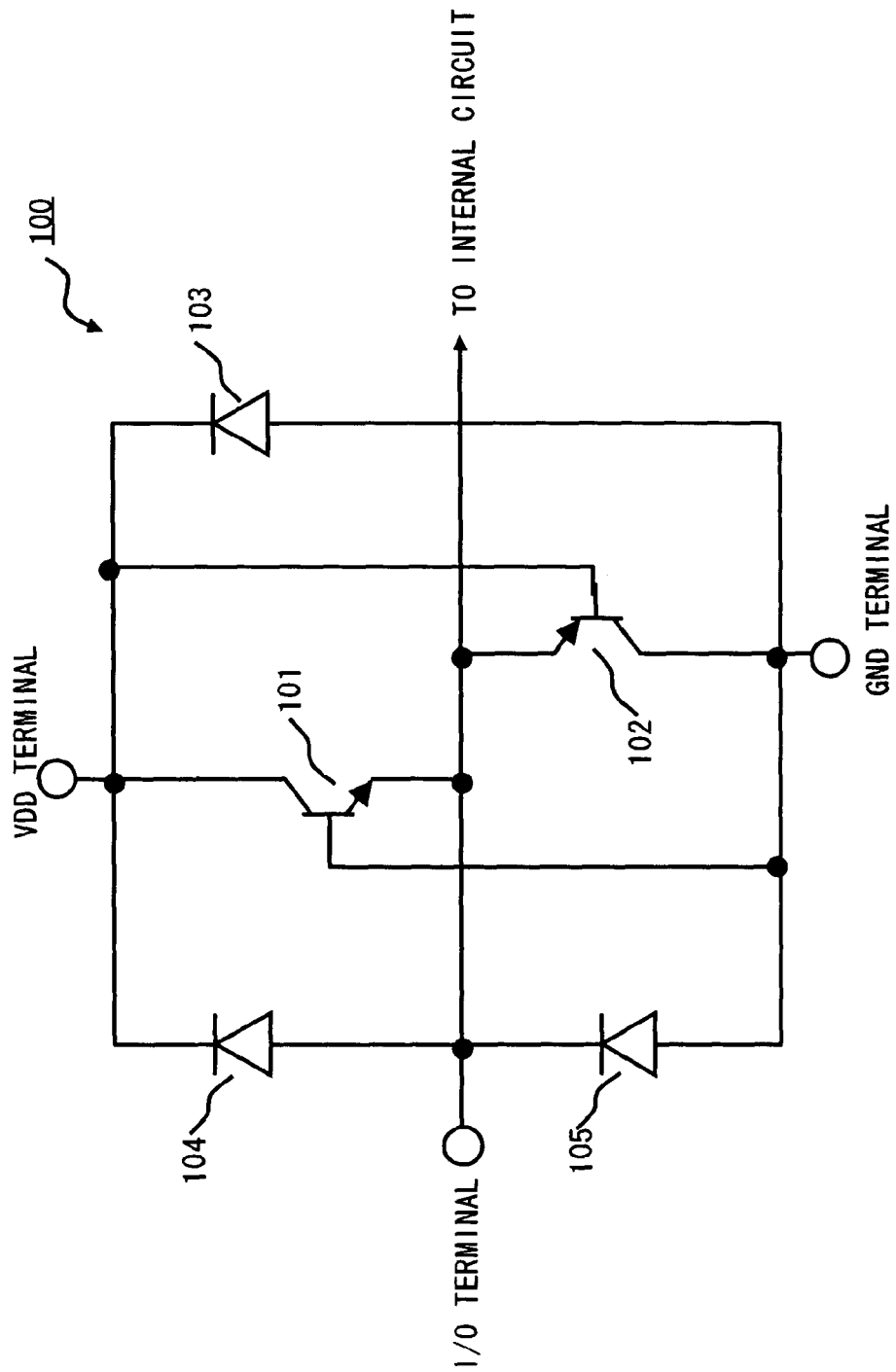
FIG. 24 is a circuit diagram of an electrostatic discharge protection device of the related art.

FIG. 23 is a sectional view of a second modified example of the second embodiment. The electrostatic discharge protection device 1a of the second modified example of the second embodiment has the same structure as that of the electrostatic discharge protection device 1 of the first embodiment except that a resistor is inserted between the base region and a terminal connected with the base region. The resistor is made of, for example, polysilicon. Further, the resistor is formed independently of the NPN transistor 2 and the PNP transistor 3. The resistor that is formed this way independently of the transistor, making it possible to process a line after the completion of manufacturing the semiconductor device and change resistance values of the resistor RNW and resistor RPW.

It is apparent that the present invention is not limited to the above embodiment but may be modified and changed without departing from the scope and spirit of the invention.

What is claimed is:

1. A semiconductor device having an electrostatic breakdown protection from a surge current impressed between a first terminal and a second terminal, the semiconductor device comprising:
   a diode impressing a forward-bias current from the first terminal to the second terminal, the diode comprising an anode terminal and a cathode terminal of a P-N junction; and
   a bipolar transistor impressing a current in a direction from the second terminal to the first terminal under an ON state,
   a continuity between a collector terminal and an emitter terminal of the bipolar transistor being attained before a potential difference between the first terminal and the second terminal reaches such a level that the diode is broken down,
   wherein at least one of the diode and the bipolar transistor includes a buried region formed below and adjacent to a semiconductor region where the emitter terminal of the bipolar transistor or one of the anode and cathode terminals of the diode is formed, with a same conductivity type as the semiconductor region and an impurity concentration lower than an impurity concentration of the semiconductor region.

2. The semiconductor device according to claim 1, wherein a starting voltage at which a continuity between the collector terminal and the emitter terminal of the bipolar transistor is ensured to be less than a breakdown voltage of the diode.

3. The semiconductor device according to claim 1, wherein a starting voltage at which a continuity between the collector terminal and the emitter terminal of the bipolar transistor is ensured to be less than a breakdown voltage of a transistor in an internal circuit of the semiconductor device.

4. The semiconductor device according to claim 1, wherein the diode is formed by a P-N junction between an emitter terminal and a base terminal of another bipolar transistor,
   wherein one of the terminals of the diode corresponds to the base terminal and the other terminal of the diode corresponds to the emitter terminal of the other bipolar transistor.

5. The semiconductor device according to claim 4, wherein at least one of the diode and bipolar transistor includes the buried region formed below and adjacent to the semiconductor region where the emitter terminal of the bipolar transistor or the diode is formed.

6. The semiconductor device according to claim 4, wherein the semiconductor region comprises an emitter region, and
   wherein at least one of the bipolar transistor and the diode of the other bipolar transistor includes a buried region formed below and adjacent to the emitter region where the emitter terminal is formed, with a same conductivity type as the emitter region and an impurity concentration lower than an impurity concentration of the emitter region.

7. The semiconductor device according to claim 4, wherein the other bipolar transistor having the diode, comprises a collector terminal connected with a first power supply terminal, the base terminal connected with the second power supply terminal, and the emitter terminal connected with an input/output terminal, and wherein the bipolar transistor comprises the collector terminal connected with the second power supply terminal, the emitter terminal connected with the input/output terminal, and a base terminal connected with the first power supply terminal.

8. The semiconductor device according to claim 4, wherein the diode and the bipolar transistor have a resistive element between the base terminal and a first power supply terminal or a second power supply terminal connected with the base terminal.

9. The semiconductor device according to claim 1, wherein the first terminal comprises a first power supply terminal or a second power supply terminal, and the second terminal comprises an input/output terminal.

10. An electrostatic discharge protection device that protects a semiconductor device from a surge current impressed between a first power supply terminal or a second power supply terminal and an input/output terminal, the electrostatic discharge protection device comprising:

a diode formed from a PN junction between an emitter terminal and a base terminal of a bipolar transistor including a collector terminal connected with the first power supply terminal, the emitter terminal connected with the input/output terminal, and the base terminal connected with the second power supply terminal; and another bipolar transistor having a collector terminal connected with the second power supply terminal, an emitter terminal connected with the input/output terminal, and a base terminal connected with the first power supply terminal, at least one of the diode and the other bipolar transistor includes a buried region formed below and adjacent to an emitter region where the emitter terminal is formed, with the same conductivity type as the emitter region and an impurity concentration lower than an impurity concentration of the emitter region.

11. The electrostatic discharge protection device according to claim 10, wherein a starting voltage at which a continuity between the collector terminal and emitter terminal of the other bipolar transistor is lower than a breakdown voltage of the PN junction of the diode.

12. The electrostatic discharge protection device according to claim 10, wherein the diode and the other bipolar transistor have a resistive element between the base terminal and the first power supply terminal or second power supply terminal connected with the base terminal.

13. The electrostatic discharge protection device according to claim 10, wherein a continuity between a collector terminal and an emitter terminal of the other bipolar transistor being attained before a potential difference between the first power supply terminal or the second power supply terminal and the input/output terminal reaches such a level that the diode is broken down, and wherein a starting voltage at which a continuity between the collector terminal and the emitter terminal of the other bipolar transistor is maintained to be less than a breakdown voltage of the diode.

* * * * *